US012603255B2

(12) United States Patent
Nakatani et al.

(10) Patent No.: US 12,603,255 B2
(45) Date of Patent: *Apr. 14, 2026

(54) PLASMA PROCESSING APPARATUS AND PLASMA PROCESSING METHOD

(71) Applicant: Hitachi High-Tech Corporation, Tokyo (JP)

(72) Inventors: Shintarou Nakatani, Tokyo (JP); Kyohei Horikawa, Tokyo (JP); Kohei Sato, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 1399 days.

This patent is subject to a terminal disclaimer.

(21) Appl. No.: 17/277,438

(22) PCT Filed: Jun. 19, 2020

(86) PCT No.: PCT/JP2020/024096

§ 371 (c)(1),
(2) Date: Mar. 18, 2021

(87) PCT Pub. No.: WO2020/256094

PCT Pub. Date: Dec. 24, 2020

(65) Prior Publication Data

US 2022/0037127 A1     Feb. 3, 2022

(30) Foreign Application Priority Data

Jun. 20, 2019     (WO) ................. PCT/JP2019/024426

(51) Int. Cl.
H01L 21/00     (2006.01)
H01J 37/32     (2006.01)
(Continued)

(52) U.S. Cl.
CPC .. *H01J 37/32541* (2013.01); *H01J 37/32183* (2013.01); *H01J 37/32449* (2013.01);
(Continued)

(58) Field of Classification Search
None
See application file for complete search history.

(56) References Cited

U.S. PATENT DOCUMENTS 10,804,080 B2 * 10/2020 Aramaki ........... H01J 37/32568
2003/0201069 A1 * 10/2003 Johnson ............ H01J 37/32082
156/345.43

(Continued)

FOREIGN PATENT DOCUMENTS

JP       2010016319 A     1/2010
JP       2011009351 A     1/2011
(Continued)

OTHER PUBLICATIONS

Search Report mailed Sep. 1, 2020 in corresponding International Application No. PCT/JP2020/024096.
(Continued)

*Primary Examiner* — Sylvia Macarthur
*Assistant Examiner* — Michelle Crowell
(74) *Attorney, Agent, or Firm* — Miles & Stockbridge, P.C.

(57)          ABSTRACT

A plasma processing apparatus including a sample stage; a ring-shaped electrode, made of a conductor, which surrounds the sample stage and to which radio frequency power is supplied; a dielectric cover above the ring-shaped electrode and covering the ring-shaped electrode; a rod suspended and disposed in a through hole disposed on an outer peripheral side portion of the base material having a disc or cylindrical shape and forming the sample stage, and having a connector portion on an upper end portion of the rod
(Continued)

connected to the ring-shaped electrode; a beam-shaped member below the sample stage below the through hole with a gap therebetween and extending in a horizontal direction, and which urges the rod upward with respect to the ring-shaped electrode; and a radio frequency power source that is connected to the rod and to the ring-shaped electrode.

6 Claims, 10 Drawing Sheets

(51) Int. Cl.
  *H01L 21/3065*       (2006.01)
  *H01L 21/311*       (2006.01)
(52) U.S. Cl.
  CPC .. *H01J 37/32577* (2013.01); *H01J 37/32642* (2013.01); *H01J 37/32724* (2013.01); *H01L 21/3065* (2013.01); *H01L 21/31116* (2013.01); *H01J 2237/334* (2013.01)

(56)       References Cited

U.S. PATENT DOCUMENTS

| | | | | |
|---|---|---|---|---|
| 2009/0242135 | A1* | 10/2009 | Koshimizu | ....... H01J 37/32091 |
| | | | | 156/345.48 |
| 2010/0000970 | A1 | 1/2010 | Koshimizu et al. | |

| | | | | |
|---|---|---|---|---|
| 2010/0326957 | A1 | 12/2010 | Maeda et al. | |
| 2015/0373783 | A1* | 12/2015 | Kitagawa | .......... H01L 21/68757 |
| | | | | 156/345.52 |
| 2016/0351404 | A1 | 12/2016 | Aramaki et al. | |
| 2017/0018411 | A1 | 1/2017 | Sriraman et al. | |
| 2018/0151325 | A1* | 5/2018 | Allen | .................. C23C 16/4585 |
| 2019/0131115 | A1* | 5/2019 | Gu | ....................... H01L 21/3065 |
| 2019/0198297 | A1* | 6/2019 | Aramaki | ............. H01L 21/3065 |
| 2019/0333785 | A1* | 10/2019 | Tanikawa | .......... H01L 21/67069 |
| 2020/0066495 | A1* | 2/2020 | Noorbakhsh | ..... H01J 37/32541 |
| 2020/0083026 | A1* | 3/2020 | Ichino | .............. H01L 21/67069 |
| 2020/0365378 | A1* | 11/2020 | Kellogg | ........... H01J 37/32715 |
| 2021/0343503 | A1* | 11/2021 | Torii | ................. H01J 37/32642 |

FOREIGN PATENT DOCUMENTS

| | | |
|---|---|---|
| JP | 2016225376 A | 12/2016 |
| JP | 2017055100 A | 3/2017 |
| JP | 2017084884 A | 5/2017 |

OTHER PUBLICATIONS

Written Opinion mailed Sep. 1, 2020 in corresponding International Application No. PCT/JP2020/024096.

\* cited by examiner

[FIG. 1]
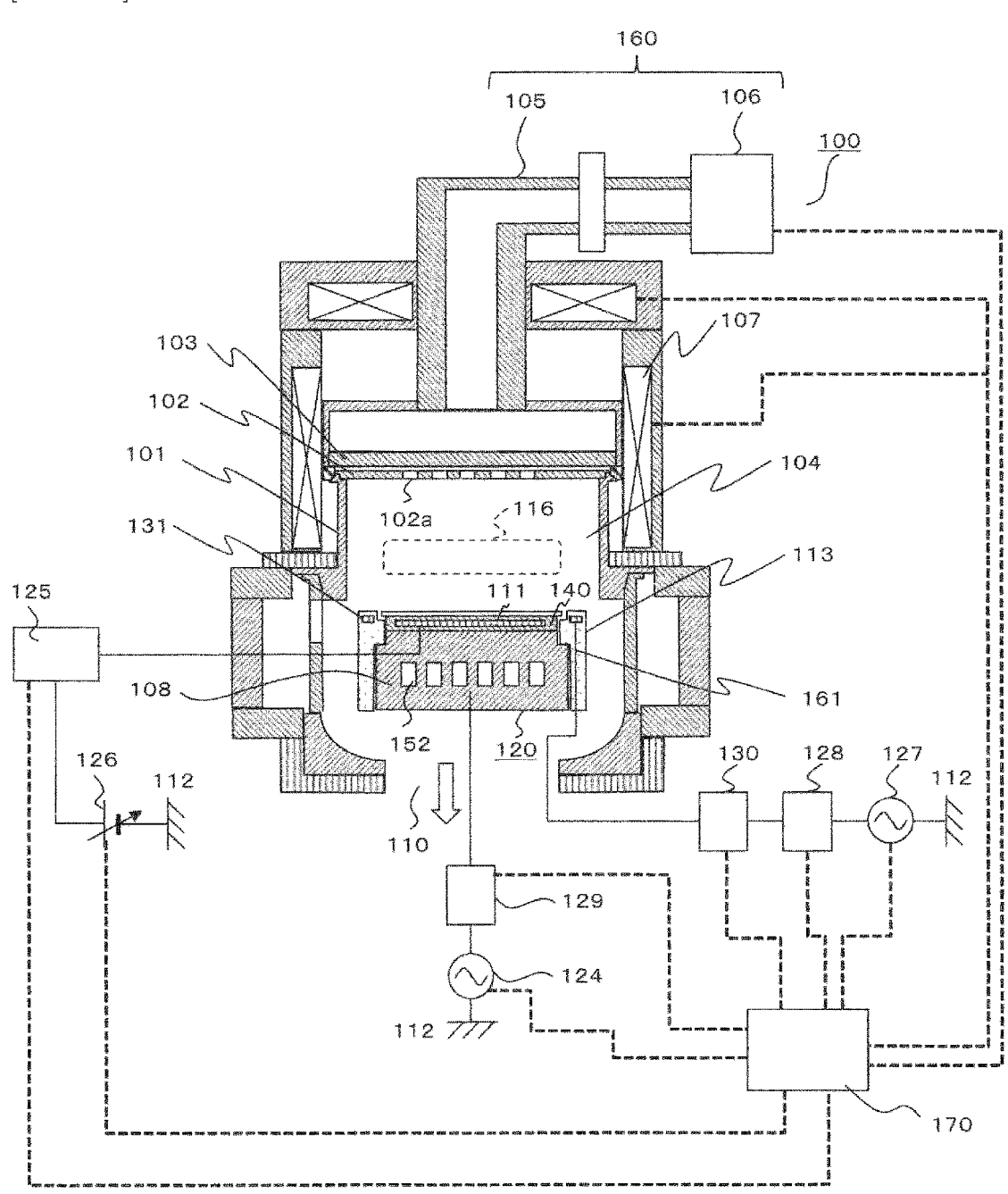

[FIG. 2]
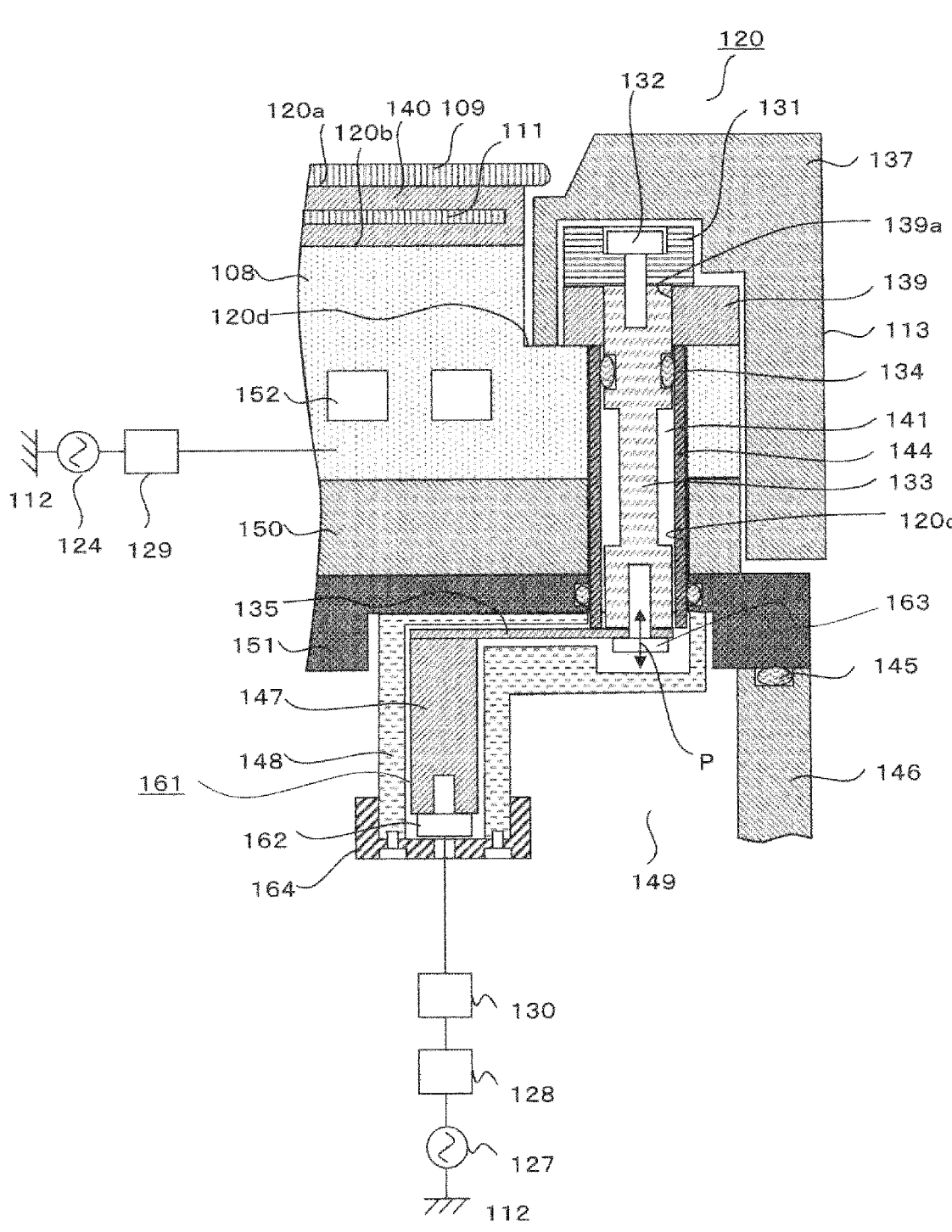

[FIG. 3]
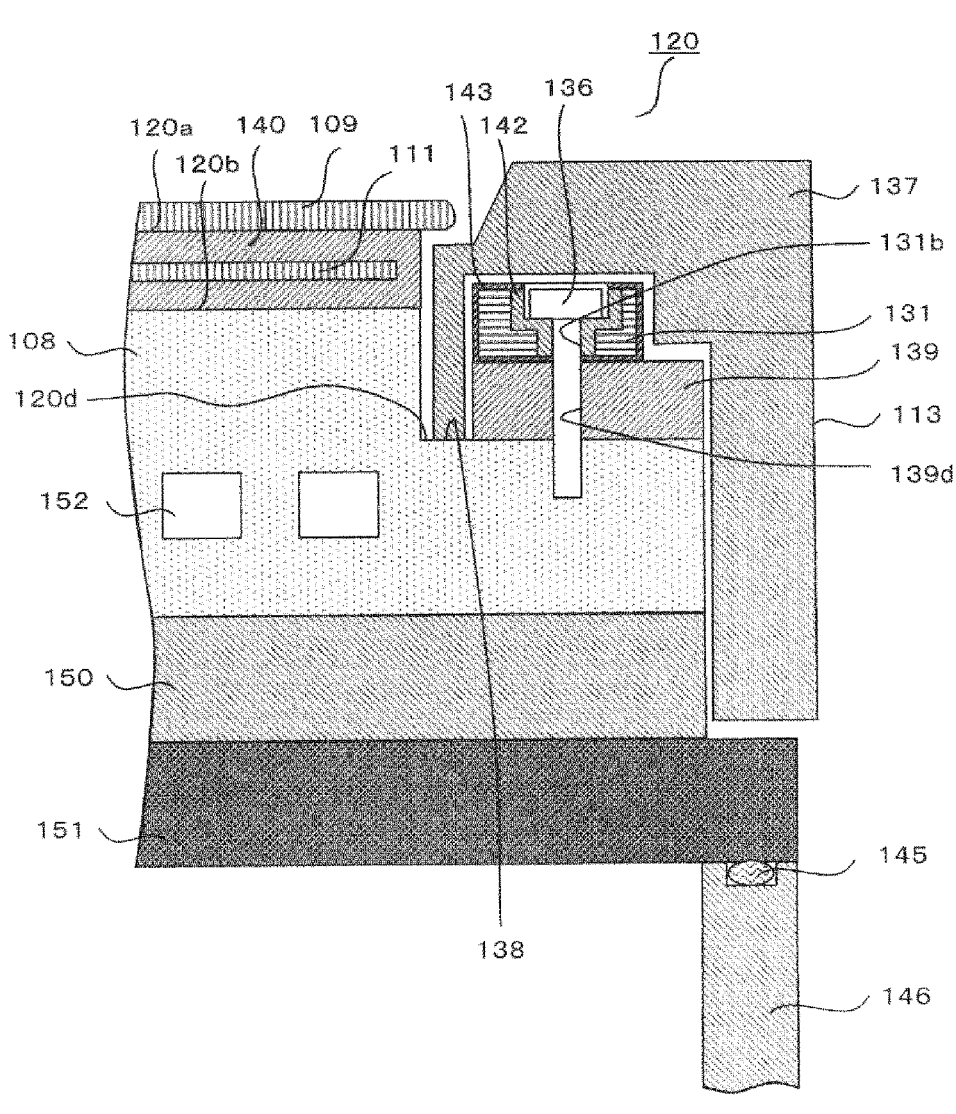

[FIG. 4]
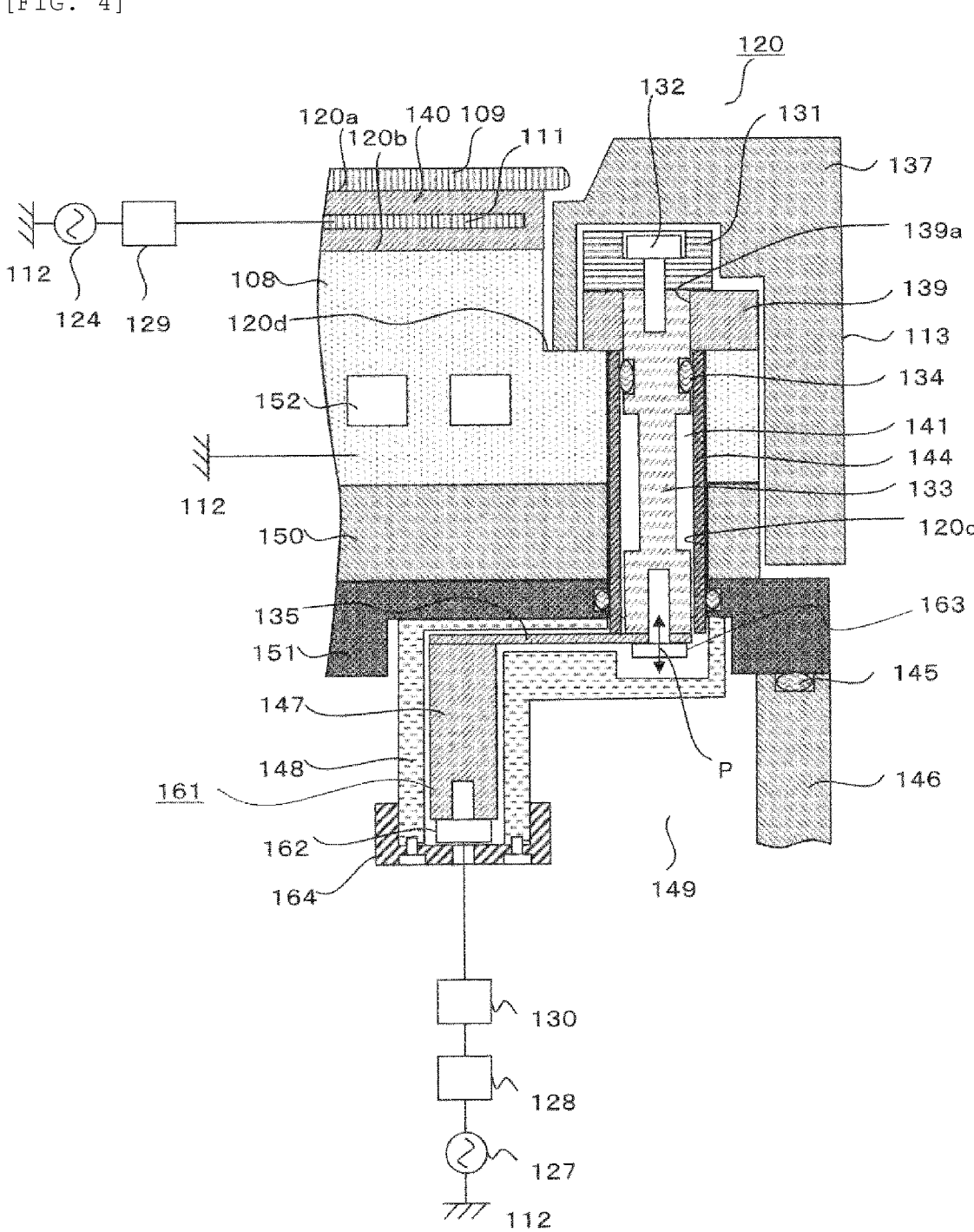

[FIG. 5]
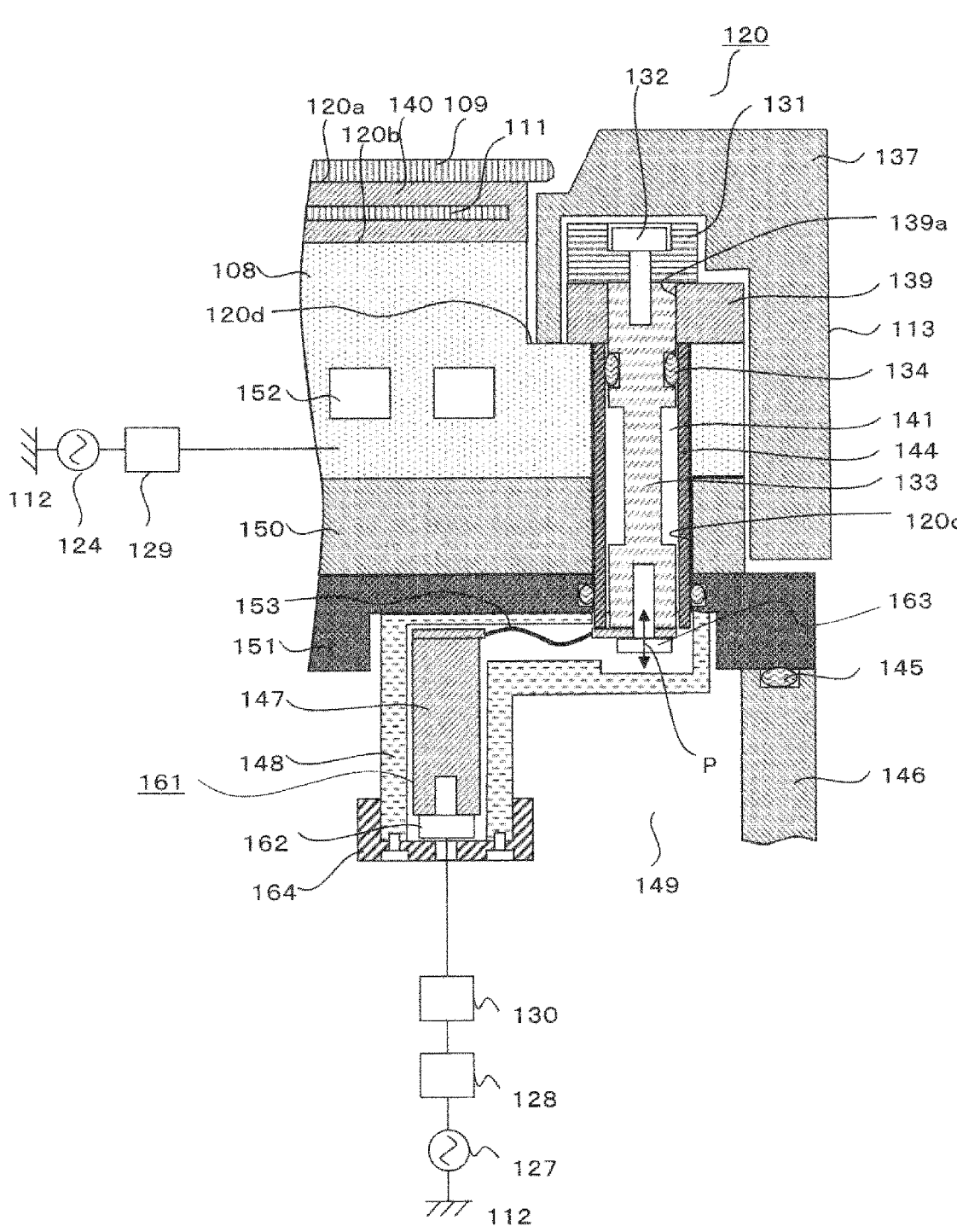

[FIG. 6]
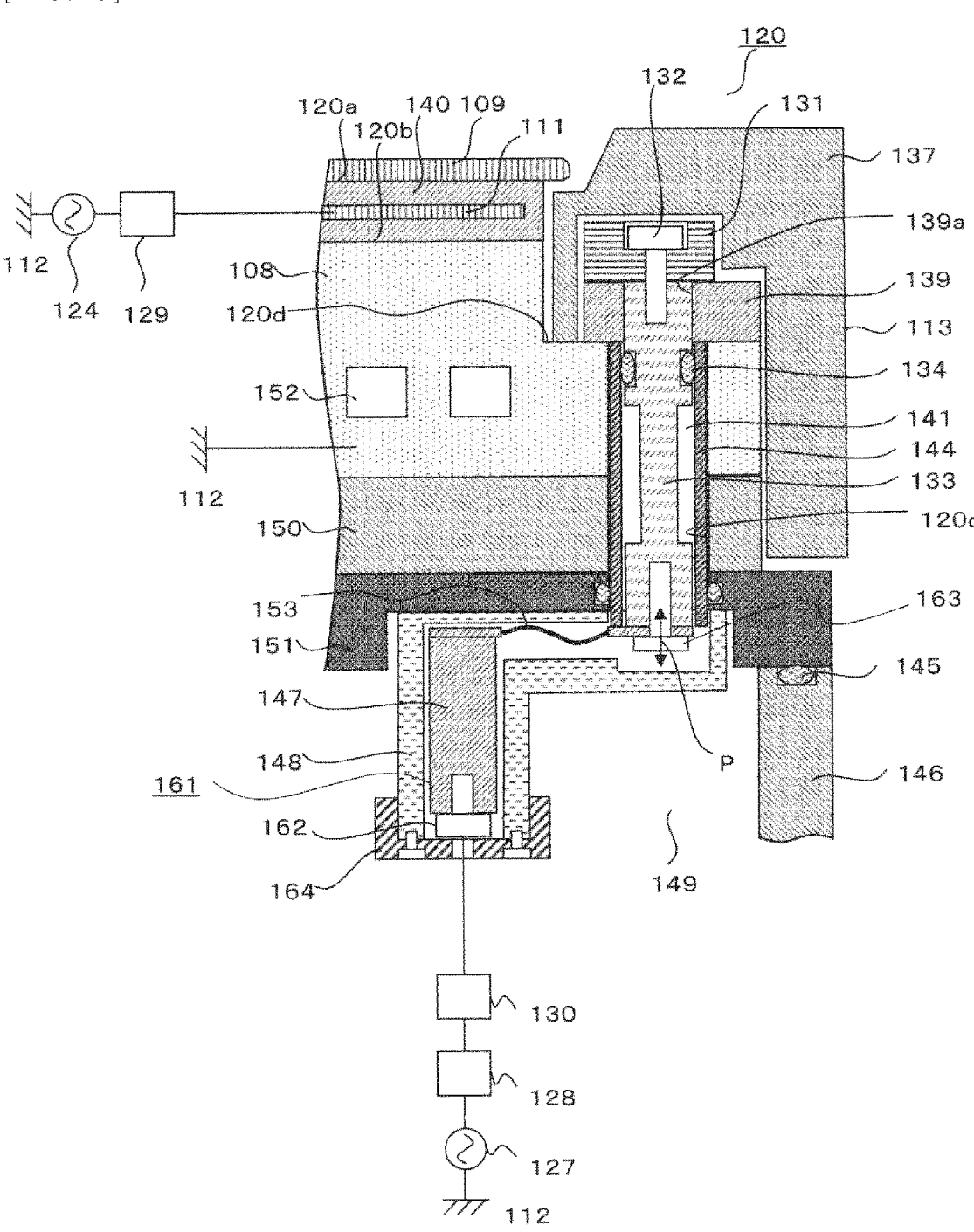

[FIG. 7]
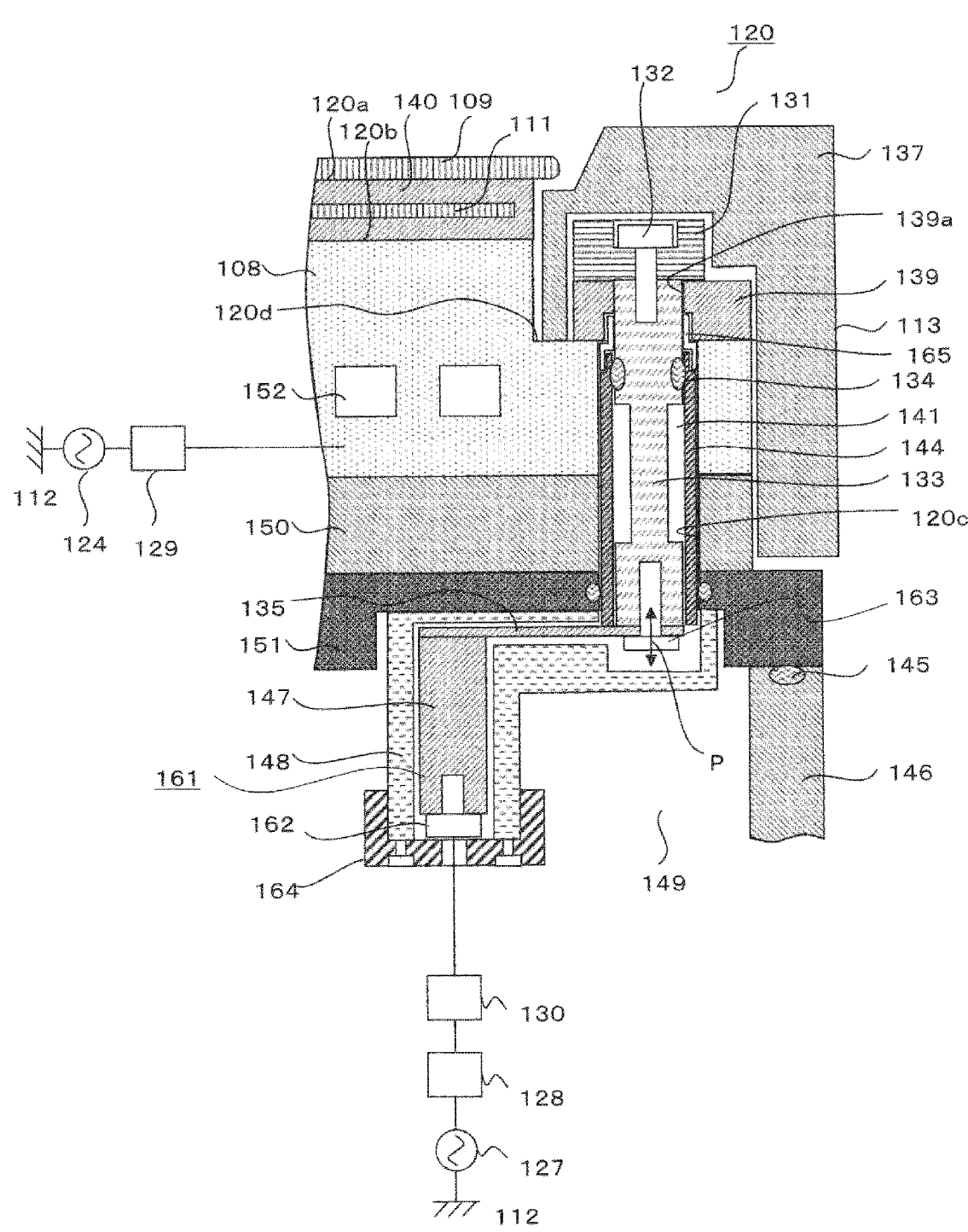

[FIG. 8]
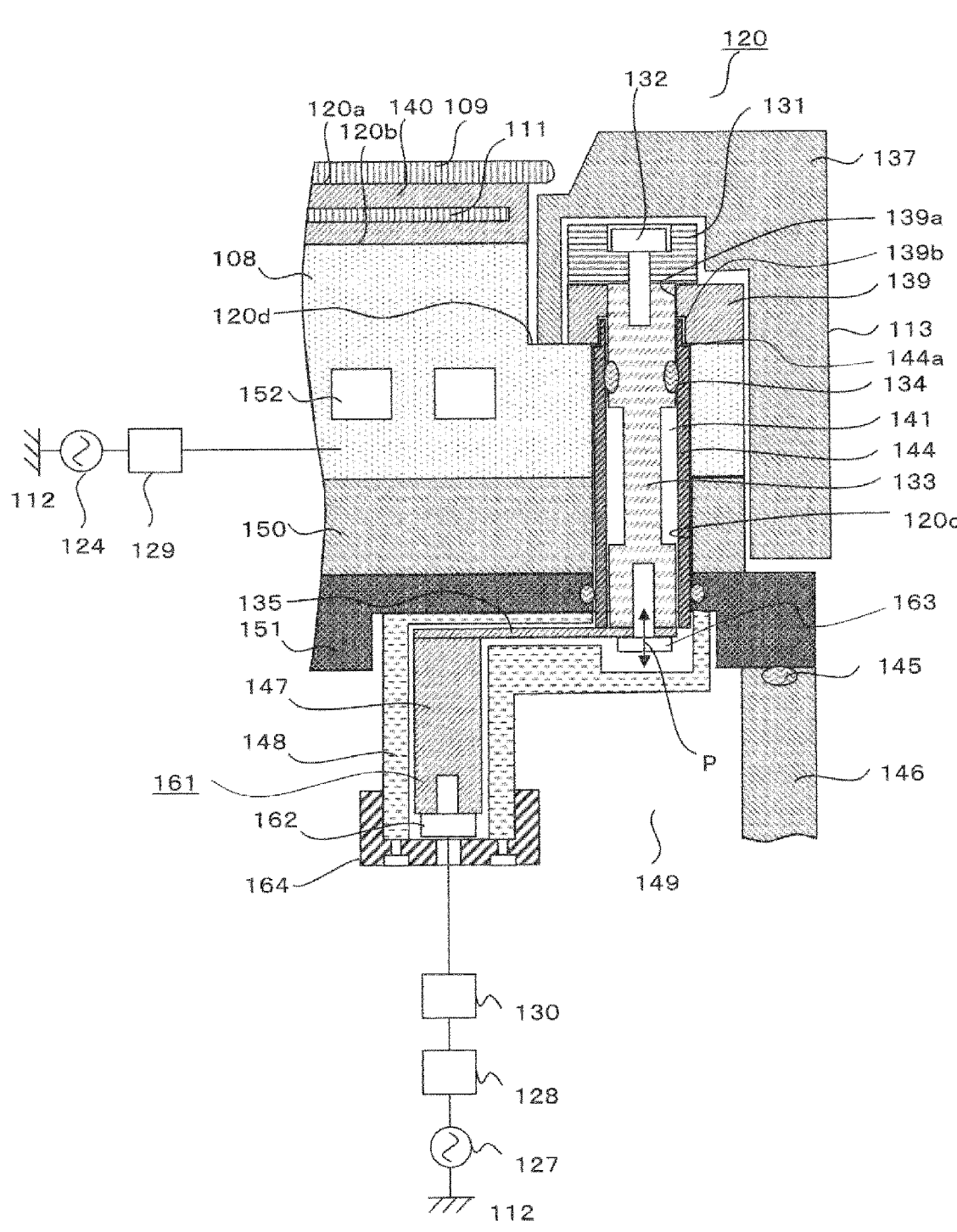

[FIG. 9]
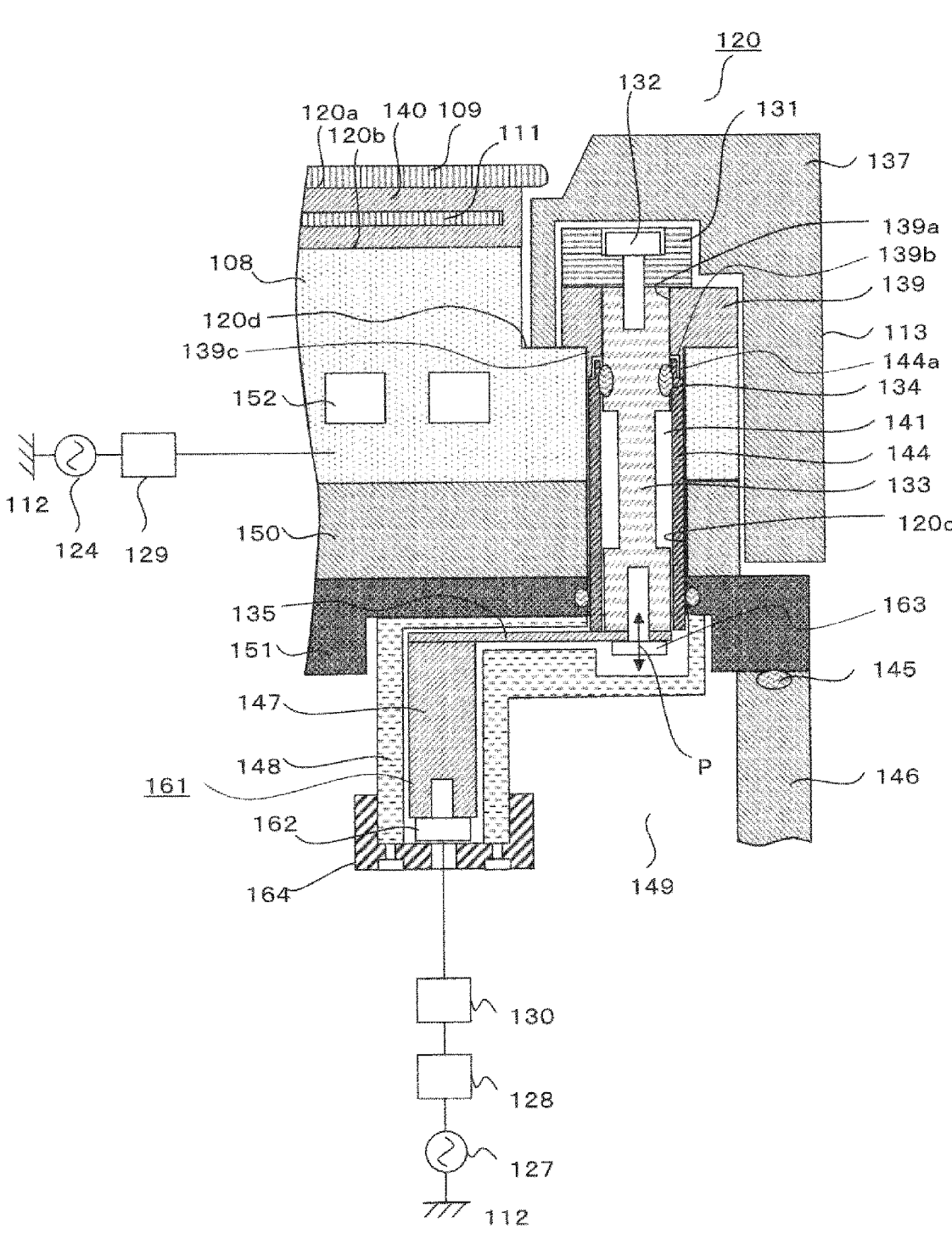

[FIG. 10]
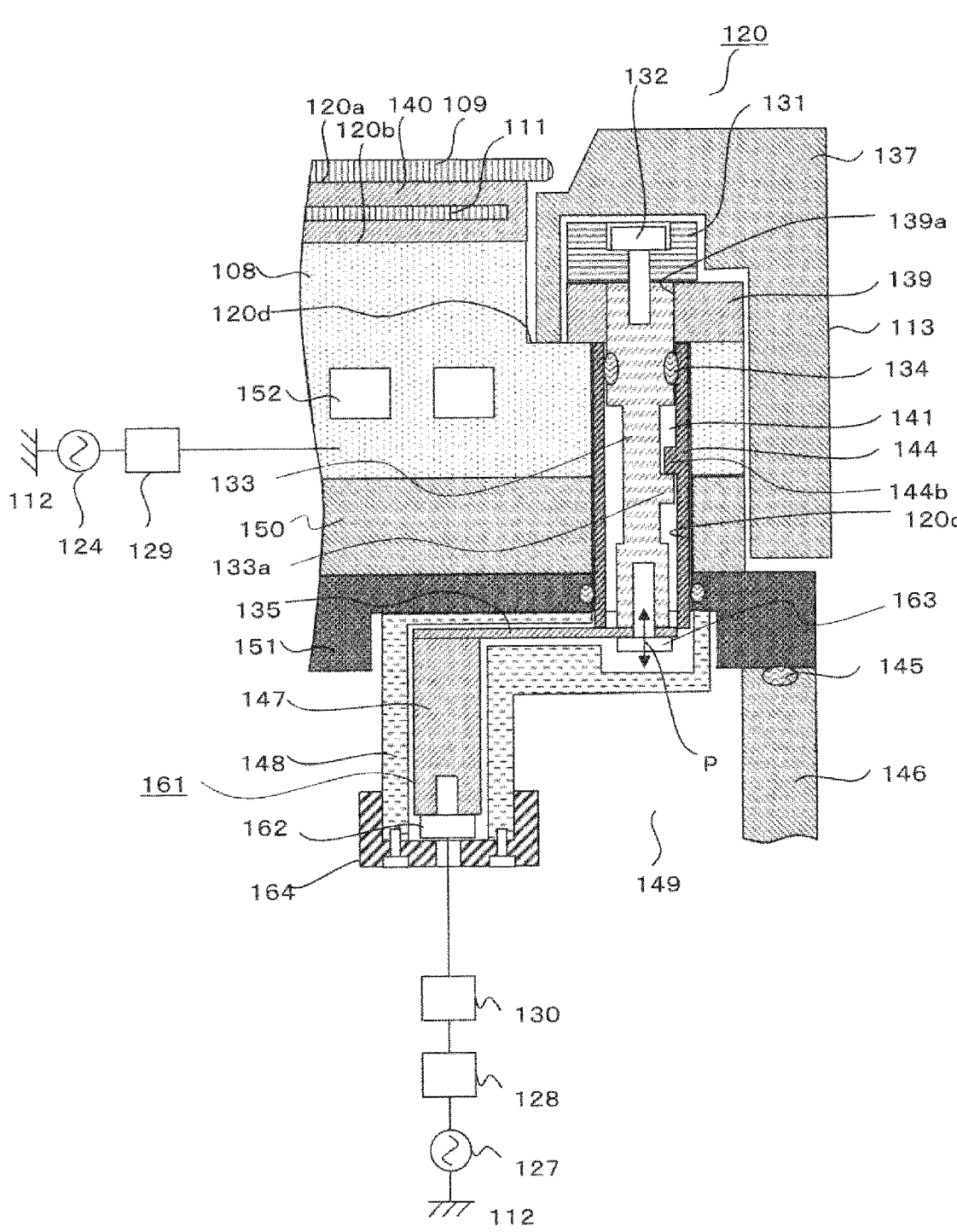

PLASMA PROCESSING APPARATUS AND PLASMA PROCESSING METHOD

TECHNICAL FIELD

The present invention relates to a plasma processing apparatus and a plasma processing method, and particularly to a plasma processing apparatus and a plasma processing method suitable for processing a material to be processed such as a semiconductor substrate.

BACKGROUND ART

In a semiconductor manufacturing process, dry etching using plasma is generally performed. Various methods are used in a plasma processing apparatus for performing the dry etching.

Generally, the plasma processing apparatus includes: a vacuum processing chamber; a gas supply apparatus connected to the vacuum processing chamber; a vacuum exhaust system that maintains a pressure in the vacuum processing chamber at a desired value; an electrode on which a wafer, which is a material to be processed, is placed; and a plasma generating unit for generating plasma in the vacuum processing chamber, or the like. By setting processing gas, which is supplied from a shower plate or the like into the vacuum processing chamber, into a plasma state by the plasma generating unit, etching processing of the wafer held on the wafer placement electrode is performed.

In recent years, with improvement of a degree of integration of a semiconductor device, microfabrication, that is, improvement of a processing accuracy is required, and a circuit structure of the semiconductor device becomes finer, so that it is required to manufacture a semiconductor device, which has good performance up to an outer peripheral edge portion of a substrate such as a semiconductor wafer on which a circuit of the semiconductor device is formed, with a high yield. That is, it is required to reduce a size of a region of the outer peripheral edge portion of the substrate such that the processing performed by the plasma processing apparatus does not deteriorate the performance of the semiconductor device. In order to prevent such deterioration of performance on an outer peripheral side portion of the substrate, concentration of an electric field is reduced in a region on the outer peripheral side of the substrate on an upper surface of a sample stage on which the substrate is placed. Then, it is necessary to prevent characteristics of the processing on the outer peripheral side portion on an upper surface of the substrate, for example, a processing speed (etching rate) from rapidly increasing in a case of the etching processing. To achieve the above, it is considered to adjust an electric field in an outer peripheral side region of the substrate including a dielectric susceptor ring disposed on the outer peripheral side of the substrate so as to cover the upper surface of the upper portion of the sample stage such that a change in a sheath thickness from a central portion to an outer periphery edge of the substrate formed above the upper surface of the substrate during the processing of the substrate is prevented.

As such a technique, for example, one disclosed in JP-A-2016-225376 (PTL 1) is known. PTL 1 discloses a technique in which a ring made of a conductor, which is covered under a ring that is made of an insulator and disposed around an outer periphery of a sample on an upper portion of a sample stage on which the sample having a substrate shape such as a semiconductor wafer is placed and which is disposed around an outer peripheral side of the sample, is applied with radio frequency power of a predetermined frequency, and a direction of entry of charged particles on an outer peripheral side portion of an upper surface of the sample is made perpendicular to the upper surface of the sample to improve a processing yield.

Further, JP-A-2011-009351 (PTL 2) discloses a technique in which radio frequency power for bias potential formation is supplied to a focus ring facing plasma, so that a magnitude of the bias potential formed above an upper surface of a conductor is adjusted according to a degree of plasma scraping and wear of the conductor, thereby preventing the processing performance from fluctuating with time.

CITATION LIST

Patent Literature

PTL 1: JP-A-2016-225376
PTL 2: JP-A-2011-009351

SUMMARY OF INVENTION

Technical Problem

The technique described above has a problem since the following points are not sufficiently taken into consideration.

That is, PTL 1 does not consider a point that, by causing series resonance on a power supply line where the radio frequency power is supplied to the conductive ring, impedance of the power supply line is lowered and a large current can flow, but an amount of heat generated in a power supply path increases due to the flowing of the large current. In particular, PTL 1 does not consider a point that, when a large current flows, a large amount of heat is generated at a connection portion of two members that form a path of a cable connector or the like disposed on a power supply path inside the sample stage, therefore there is a risk of damaging the above connection portion or adversely affecting surrounding members.

Further, also in PTL 2, since the focus ring faces the plasma, there is a risk that a current having the radio frequency power from the power supply line to the focus ring will flow into the plasma due to contact with the plasma, and in this case, the problem similar to that in PTL 1 occurs. The technique of PTL 2 does not consider points that, more heat is generated at a connection portion on a power supply path inside a sample stage and the power supply path is damaged, which impairs the reliability of the apparatus, and as a result of temperature non-uniformity on an upper surface of the sample stage or an upper surface of a wafer placed on the sample stage due to an influence of heat generation, a shape after processing deviates significantly from a desired shape.

An object of the invention is to provide a plasma processing apparatus or a plasma processing method capable of improving a reliability or a yield.

The above object and new features of the invention will become apparent from the description of this specification and the accompanying drawings.

Solution to Problem

The typical ones of the embodiments disclosed in the present application will be briefly described as follows.

A plasma processing apparatus in one embodiment includes: a vacuum container having a processing chamber therein in which plasma is formed; a sample stage that is disposed in a lower portion of the processing chamber and has a placement surface on which a semiconductor wafer to be processed is placed; and an electric field forming device that forms an electric field for plasma formation using gas supplied to the processing chamber. The plasma processing apparatus further includes: a first electrode that forms the sample stage and is supplied with a first radio frequency power from a first radio frequency power source during formation of the plasma; a ring-shaped member made of a dielectric that is disposed on an outer peripheral portion of the placement surface of the sample stage and covers a surface of the sample stage; a second electrode that is disposed inside the ring-shaped member and supplied with a second radio frequency power from a second radio frequency power source. The plasma processing apparatus further includes: a film-shaped electrostatic adsorption electrode that forms the placement surface of the sample stage and is supplied with direct current power for adsorbing the semiconductor wafer by static electricity; and a power supply connector that forms a path for supplying the second radio frequency power to the second electrode. Then, the power supply connector includes a conductive member, which abuts on a conductive cylindrical member disposed inside an insulating cylindrical member disposed in a through hole penetrating the inside of a portion of the sample stage covered by the ring-shaped member, whose both ends facing each other in a longitudinal direction and whose one end is fixed and does not abut on the conductive cylindrical member, and has elasticity that can be flexed and deformed in an upper-lower direction in conjunction with downward stretching of the conductive cylindrical member.

Further, a plasma processing method in one embodiment includes: (a) a step of placing a semiconductor wafer on a sample stage provided in a vacuum container in which plasma processing is performed; and (b) a step of forming plasma on the semiconductor wafer placed on the sample stage and supplying a first radio frequency power from a first radio frequency power source to the sample stage to perform the plasma processing on the semiconductor wafer during formation of the plasma. Further, during the plasma processing, a second radio frequency power is supplied from a second radio frequency power source to an electrode disposed on an upper portion of an outer peripheral portion of the sample stage via a power supply connector provided on the sample stage. Further, the second radio frequency power is supplied via the power supply connector including a conductive member, which abuts on the conductive cylindrical member disposed in a through hole penetrating the inside of a portion of the sample stage covered by a ring-shaped member, whose both ends facing each other in a longitudinal direction and whose one end is fixed and does not abut on the conductive cylindrical member, and has elasticity that can be flexed and deformed in an upper-lower direction in conjunction with downward stretching of the conductive cylindrical member.

Advantageous Effect

Effects obtained by typical ones of the invention disclosed in the present application will be briefly described as follows.

A reliability of a plasma processing apparatus can be improved, and a yield in plasma processing can be improved.

BRIEF DESCRIPTION OF DRAWINGS

FIG. 1 is a cross-sectional view schematically showing an outline of a configuration of a plasma processing apparatus according to an embodiment of the invention.

FIG. 2 is a cross-sectional view schematically showing an enlarged configuration of a portion of a susceptor ring of a sample stage of the plasma processing apparatus shown in FIG. 1.

FIG. 3 is a cross-sectional view schematically showing an enlarged configuration of another portion of the susceptor ring of the plasma processing apparatus according to the present embodiment shown in FIG. 2.

FIG. 4 is a cross-sectional view schematically showing an enlarged configuration of a portion of a susceptor ring of a sample stage of a plasma processing apparatus according to a modification of the embodiment of the invention shown in FIG. 2.

FIG. 5 is a cross-sectional view schematically showing an enlarged configuration of a portion of a susceptor ring of a sample stage of a plasma processing apparatus according to another modification of the embodiment shown in FIG. 2.

FIG. 6 is a cross-sectional view schematically showing an enlarged configuration of a portion of a susceptor ring of a sample stage of a plasma processing apparatus according to a further modification of the embodiment shown in FIG. 2.

FIG. 7 is a cross-sectional view schematically showing an enlarged configuration of a portion of a susceptor ring of a sample stage of a plasma processing apparatus according to another embodiment of the invention.

FIG. 8 is a cross-sectional view schematically showing an enlarged configuration of a portion of a susceptor ring of a sample stage of a plasma processing apparatus according to a modification of the other embodiment of the invention.

FIG. 9 is a cross-sectional view schematically showing an enlarged configuration of a portion of a susceptor ring of a sample stage of a plasma processing apparatus according to a modification of the other embodiment of the invention.

FIG. 10 is a cross-sectional view schematically showing an enlarged configuration of a portion of a susceptor ring of a sample stage of a plasma processing apparatus according to a modification of the other embodiment of the invention.

DESCRIPTION OF EMBODIMENTS

In a plasma processing apparatus in the related art, a wafer placement electrode placed in a processing chamber and on an upper surface of which a wafer is placed is heated by receiving heat transferred from plasma formed in the processing chamber during wafer processing or heat generated by an interaction between the plasma and a film preformed and disposed on a surface of the wafer. At this time, among members disposed on an upper portion of the wafer placement electrode and forming the wafer placement electrode, for a base material made of a conductive material such as metal and an insulating plate made of an insulating material or a dielectric material that is integrally disposed below the base material by being fastened with screws or bolts and connected to the base material, as a result of expansion of the base material and the insulating plate that occurs as a temperature rises, there are differences in obtained dimensions and shapes due to a difference in thermal expansion coefficients, and as a result, a shape of the upper portion of the integrally connected wafer placement electrode is distorted or fluctuated from the initial one such as bending or unevenness.

A through hole, which penetrates the member forming the upper portions of the base material and the insulating plate of the wafer placement electrode that are distorted, changes in a dimension such as a length and an angle or a direction of a central axis, and accordingly, a position of a member disposed inside the through hole or the member placed on the upper portion of the wafer placement electrode and a relative distance between the members change. In particular, the above-described distortion and deformation become large on the outer peripheral side of the member on the upper portion of the wafer placement electrode having a disc or cylindrical shape. For example, when the wafer placement electrode has a configuration in which a ring made of a conductor to which radio frequency power is supplied is disposed on the outer peripheral side of the upper portion of the wafer placement electrode, a distance between the ring and an end portion of the power supply path which is disposed inside a wafer placement electrode 120 and energized with the radio frequency power supplied to the ring changes with the occurrence of the above deformation and distortion, and an external force that attempts to deform or displace a connector portion connecting the ring and the end portion acts.

Therefore, in the technique in the related art, when the external force exceeds a structural strength of a connector, the connector may be damaged. Further, even if the magnitude of deformation or distortion that occurs is within an allowable range of the connector, when a plurality of wafers are processed continuously, the wafer placement electrode and a part of the connector mounted on the wafer placement electrode are repeatedly deformed, displaced, or distorted due to heating for processing using plasma and cooling after the processing is completed, and expansion and contraction associated therewith. Then, when sliding occurs in a portion where the two members of the part of the connector are connected due to the repetition of such deformation, displacement, or distortion, as a result of this sliding, a reactant may be formed due to an interaction caused by wear and heat generation, and contamination, deterioration of conduction performance, and damage to the members may occur. Therefore, there is a risk that the reliability of the plasma processing apparatus over a long period of time will be impaired.

The invention of the present application is conceived to solve the above problems.

Hereinafter, embodiments of the invention will be described with reference to the drawings.

First Embodiment

Hereafter, an embodiment of the invention will be described with reference to FIGS. 1 to 4.

FIG. 1 is a cross-sectional view schematically showing an outline of a configuration of a plasma processing apparatus according to an embodiment of the invention. In particular, FIG. 1 shows a plasma etching apparatus for etching a sample having a substrate shape such as a semiconductor wafer by using plasma that is formed by using a microwave electric field as an electric field and generating electron cyclotron resonance (ECR) between the microwave electric field and a magnetic field.

A plasma etching apparatus 100 shown in FIG. 1 will be described. The plasma etching apparatus 100 includes a vacuum container 101 having a processing chamber 104 in which plasma is formed. A dielectric window 103 (for example, made of quartz) having a disc shape is placed as a lid member above an upper end of a side wall of an upper portion having a cylindrical shape of the vacuum container 101 to form a portion of the vacuum container 101. A sealing member such as an O-ring is sandwiched and disposed between a back surface of a peripheral edge portion of the dielectric window 103 and the upper end of the side wall having the cylindrical shape of the vacuum container 101 in a state where the dielectric window 103 is placed above the side wall of the vacuum container 101 having a cylindrical shape, and deformation of the sealing member occurs due to the inside of the processing chamber 104 inside the vacuum container 101 is exhausted and decompressed and the dielectric window 103 is pressed against the vacuum container 101, and thus the inside and outside of the vacuum container 101 or the processing chamber 104 are airtightly partitioned.

Further, a vacuum exhaust port 110 having a circular opening facing the processing chamber 104 is disposed at a lower portion of the vacuum container 101, and communicates with a vacuum exhaust apparatus (not shown) which is disposed and connected below the vacuum container 101. Further, a shower plate 102 forming a circular ceiling surface of the processing chamber 104 and facing the processing chamber 104 is provided below a lower surface of the dielectric window 103 forming a lid member of an upper portion of the vacuum container 101. The shower plate 102 has a disc shape having a plurality of gas introduction holes 102a disposed so as to penetrate a central portion, and gas for etching processing is introduced into the processing chamber 104 from above through the gas introduction holes 102a. The shower plate 102 of the present embodiment is made of a dielectric material such as quartz.

An electric field and magnetic field forming portion 160 that forms an electric field and a magnetic field for generating plasma 116 inside the processing chamber 104 is disposed at a position on an outer upper side of the upper portion of the vacuum container 101. The electric field and magnetic field forming portion 160 is provided in the plasma etching apparatus 100 including the following configurations. That is, the electric field and magnetic field forming portion 160 is disposed above the dielectric window 103 and includes a waveguide 105 through which the electric field is transmitted to introduce a radio frequency electric field having a predetermined frequency for generating the plasma 116 into the processing chamber 104, a cylindrical portion forming the lower portion of the electric field and magnetic field forming portion 160 has an axis in an upper-lower direction, and a lower end portion of a cylinder having a diameter smaller than that of the dielectric window 103 is disposed above a central portion of an upper surface of the dielectric window 103. Further, an electric field generating power source 106 formed by transmitting a radio frequency electric field transmitted inside the waveguide 105 is provided at the other end portion of the waveguide 105. The predetermined frequency of the electric field is not particularly limited, but 2.45 GHz microwaves are used in the present embodiment.

A magnetic field generating coil 107 is disposed so as to surround each of a lower end portion of a cylindrical portion of the waveguide 105 above the dielectric window 103 of the processing chamber 104 and an outer peripheral side of the side wall of the vacuum container 101 forming the cylindrical portion of the processing chamber 104. The magnetic field generating coil 107 includes electromagnets and yokes disposed in a plurality of stages in the upper-lower direction in which a direct current is supplied to form a magnetic field.

In the above configuration, in a state where the gas for processing is introduced into the processing chamber 104 from the gas introduction holes 102a of the shower plate 102, the microwave electric field oscillated by the electric field generating power source 106 propagates inside the waveguide 105, passes through the dielectric window 103 and the shower plate 102, and is supplied to the processing chamber 104 from above to below. Further, the magnetic field generated by the direct current supplied to the magnetic field generating coil 107 is supplied into the processing chamber 104 and interacts with the microwave electric field to generate the electron cyclotron resonance (ECR). The ECR excites, dissociates, or ionizes atoms or molecules of the gas for processing, and the plasma 116 having a high density is generated in the processing chamber 104.

A wafer placement electrode (first electrode) 120 forming the sample stage is disposed on the lower portion of the processing chamber 104 below a space where the plasma 116 is formed. The wafer placement electrode 120 has a cylindrical projecting (protruding) portion whose upper surface is higher than the outer peripheral side in the central portion of the upper portion thereof, and has a placement surface 120a on which a semiconductor wafer (hereinafter, simply referred to as a wafer) 109, which is a sample (processed object), is placed on an upper surface of a protruding upper portion. The placement surface 120a is disposed so as to face the shower plate 102 or the dielectric window 103.

As shown in FIG. 2, an upper surface 120b of a protruding portion of an electrode base material 108 forming the upper portion of the wafer placement electrode 120 is covered with a dielectric film 140, and the dielectric film 140 forms the placement surface 120a. A plurality of conductor films 111, which are films made of conductors for electrostatic adsorption connected to a direct current power source 126 via a radio frequency filter 125 shown in FIG. 1, are disposed inside the dielectric film 140. Here, the inside of the conductor films 111 is supplied with direct current power for adsorbing a semiconductor wafer by static electricity, and the conductor films 111 are film-shaped electrostatic adsorption electrodes for forming the static electricity for adsorbing the wafer 109 by sandwiching an upper portion of the dielectric film 140 covering the conductive films 111. The conductor films 111 of the present embodiment have a shape that is similar to a circle or a shape that can be regarded as a circle when viewed from above and are a plurality of films disposed and insulated from each other by a predetermined distance, and one of the plurality of film-shaped electrodes and the other may be bipolar type to which different polarities are given, or unipolar type to which the same polarity is given. Although only a single conductor film 111 is disclosed in FIG. 1, in the present embodiment, the plurality of conductor films 111 to which different polarities are given as bipolar electrostatic adsorption electrodes are disposed inside the dielectric film 140.

The electrode base material 108, which has a circular or cylindrical shape made of a conductor and is disposed inside the wafer placement electrode 120, is connected to a radio frequency power source 124 via a matching device 129 through a power supply path including wiring such as a coaxial cable. The radio frequency power source (first radio frequency power source) 124 and the matching device 129 are disposed at positions closer than a distance between the radio frequency filter 125 and the conductor films 111. Further, the radio frequency power source 124 is connected to a grounding portion 112.

In the present embodiment, during the processing of the wafer 109, radio frequency power (first radio frequency power) having a predetermined frequency is supplied from the radio frequency power source 124, and a bias potential having a distribution corresponding to a difference with a potential of the plasma 116 is formed above the wafer 109 which is adsorbed and held on the upper surface of the dielectric film 140 of the wafer placement electrode 120. In other words, the sample stage includes the wafer placement electrode (first electrode) 120 to which the radio frequency power (first radio frequency power) is supplied from the radio frequency power source 124 while the plasma 116 is formed.

Refrigerant flow paths 152, which are disposed spirally or concentrically and multiply around a central axis in the upper-lower direction of the electrode base material 108 or the wafer placement electrode 120 and through which a refrigerant whose temperature is adjusted to a predetermined range flows, are provided inside the electrode base material 108, in order to remove transferred heat and cool the wafer placement electrode 120. An inlet and an outlet of the refrigerant flow paths 152 to the wafer placement electrode 120 are connected by a pipeline to a temperature controller that has a refrigerating cycle (not shown) and adjusts the temperature of the refrigerant within a predetermined range by heat transfer, and the refrigerant that flows through the refrigerant flow paths 152 and whose temperature changes due to heat exchange flows out from the outlet is brought into the predetermined temperature range through a flow path inside the temperature controller via the pipeline, and then supplied to the refrigerant flow paths 152 in the electrode base material 108 and circulates.

On the outer peripheral side of the placement surface 120a having the circular shape similar to that of the wafer 109 in the protruding portion of the electrode base material 108 of the wafer placement electrode 120, a recessed portion 120d disposed in a ring shape when viewed from above is disposed so as to surround the outer peripheral side of the placement surface 120a. On a ring-shaped upper surface of the recessed portion 120d formed at a height lower than the placement surface 120a of the sample stage, a susceptor ring 113, which is a ring-shaped member made of a dielectric material such as ceramics such as quartz or alumina, is placed, and a bottom surface of the recessed portion 120d or a cylindrical side wall surface of the protruding portion is covered with respect to the plasma 116.

For the susceptor ring 113 of the present embodiment, a cylindrical side wall portion forming an outer peripheral edge of the ring-shaped portion has a dimension in which a lower end of the side wall portion extends below the recessed portion 120d to cover the electrode base material 108 of the wafer placement electrode 120 or a cylindrical side wall surface of an insulating plate 150 described later in a state where the susceptor ring 113 is placed on the recessed portion 120d. Further, for the susceptor ring 113, in a state where the susceptor ring 113 is placed on the recessed portion 120d and the bottom surface of the ring-shaped portion is in contact with the recessed portion 120d or an upper surface of a protective dielectric film covering the recessed portion 120d, a flat upper surface of the susceptor ring 113 has a dimension higher than that of the placement surface 120a.

In the present embodiment, apparatuses for adjusting operations of the plasma etching apparatus 100 including an apparatus which is configured with an electric field and magnetic field adjustment system such as the electric field generating power source 106, the magnetic field generating coil 107, the radio frequency power source 124, the radio frequency filter 125, the direct current power source 126, a radio frequency power source 127, matching devices 128, 129, and a load impedance variable box 130, or a pressure adjustment system such as a vacuum exhaust apparatus or a mass flow controller that adjusts a gas supply amount, which will be described later, is provided. Each of the apparatuses includes a detector for detecting a state of an operation such as output, flow rate, or pressure, and is communicably connected to a controller 170 via wired or wireless communication. When a signal indicating the state of the operation output from the detector provided in each of these apparatuses is transmitted to the controller 170, an arithmetic unit of the controller 170 reads software stored in a storage device inside the controller 170, detects an amount of the state from the received signal from the detector based on the algorithm, and calculates and transmits a command signal for adjusting the amount of the state to an appropriate value. The apparatus, which receives the command signal and is provided in the electric field and magnetic field adjustment system or the pressure adjustment system, adjusts the operations according to the command signal.

In such a plasma etching apparatus 100, the unprocessed wafer 109, which is placed on an tip end of an arm of a wafer transfer robot disposed in a vacuum transfer chamber decompressed to a pressure similar to that of the processing chamber 104 inside a vacuum transfer container, which is another vacuum container connected to the side wall of the vacuum container 101, is carried into the processing chamber 104 in a state where a gate valve of a gate, which is a passage that communicates between the vacuum transfer chamber and the processing chamber 104, disposed in the vacuum transfer chamber, is opened, and the wafer 109 is placed on the tip end of the arm through the gate by the extension of the arm. Further, the wafer 109 transferred to the upper portion of the placement surface 120a of the wafer placement electrode 120 in the processing chamber 104 is delivered onto a lift pin by moving the lift pin up and down, and after the wafer 109 is further placed on the placement surface 120a, the wafer 109 is absorbed to and held on the placement surface 120a of the wafer placement electrode 120 by a static electricity force formed by the direct current power applied from the direct current power source 126.

After the transfer robot leaves the processing chamber 104 into the vacuum transfer chamber by the contraction of the arm, the gate valve airtightly closes the gate from the vacuum transfer chamber to seal the inside of the processing chamber 104. In this state, gas for etching processing is supplied into the processing chamber 104 through a gas supply pipeline configured with a pipe connecting a gas source and the vacuum container 101. On the pipe, the mass flow controller (not shown), which is a flow path controller that has a flow path through which the gas flows and a valve that is disposed on the flow path and increases or decreases or opens or closes a cross-sectional area of the flow path to adjust the flow rate to a value within a desired range, and accordingly, the flow rate or speed is adjusted and the gas is introduced into a gap space between the dielectric window 103 and the quartz shower plate 102 from the flow path in the vacuum container 101 connected to an end portion of the pipe. The introduced gas is diffused in this space and then introduced into the processing chamber 104 through the gas introduction holes 102a of the shower plate 102.

Gas and particles inside the processing chamber 104 are exhausted through the vacuum exhaust port 110 by the operation of the vacuum exhaust apparatus connected to the vacuum exhaust port 110. The inside of the processing chamber 104 is adjusted to a predetermined value within a range suitable for processing the wafer 109 according to balance between the gas supply amount from the gas introduction holes 102a of the shower plate 102 and an exhaust gas amount from the vacuum exhaust port 110.

Also, when the wafer 109 is adsorbed and held, gas having heat transfer property such as He (helium) is supplied from an opening (not shown) on the upper surface of the dielectric film 140 into a gap between the wafer 109 and the upper surface of the dielectric film 140, which is the placement surface 120a of the wafer placement electrode 120, and accordingly, heat transfer between the wafer 109 and the wafer placement electrode 120 is promoted. The refrigerant adjusted to a temperature within a predetermined range flows and circulates through the refrigerant flow path 152 disposed in the electrode base material 108 of the wafer placement electrode 120, so that a temperature of the wafer placement electrode 120 or the electrode base material 108 is adjusted in advance before the wafer 109 is placed. Therefore, by transferring heat between the wafer 109 and the wafer placement electrode 120 or the electrode base material 108 having a large heat capacity, a temperature of the wafer 109 is adjusted to be close to the temperature of the wafer placement electrode 120 or the electrode base material 108 before processing, and even after the start of the processing, heat from the wafer 109 is transferred and the temperature of the wafer 109 is adjusted.

In this state, a microwave electric field and a magnetic field are supplied into the processing chamber 104, and the plasma 116 is generated using gas. When the plasma 116 is formed, radiofrequency (RF) power is supplied to the electrode base material 108 from the radio frequency power source 124, a bias potential is formed above the upper surface of the wafer 109, and charged particles such as ions in the plasma 116 are attracted to the upper surface of the wafer 109 according to a potential difference between the bias potential and a potential of the plasma 116. Further, the charged particles collide with a surface of a film layer to be processed, which is a film structure including a mask and a film layer to be processed, which are disposed in advance on the upper surface of the wafer 109, and the etching processing is performed. During the etching processing, the processing gas introduced into the processing chamber 104 and particles of a reaction product generated during the processing are exhausted from the vacuum exhaust port 110.

When the etching processing of the film layer to be processed progresses and it is detected by an endpoint detector or a film thickness detector (not shown) that the processing has reached a predetermined etching amount or remaining film thickness, the supply of the radio frequency power from the radio frequency power source 124 is stopped, supply of power to the electric field generating power source 106 and the magnetic field generating coil 107 is stopped, the plasma 116 is extinguished, and the etching processing is stopped. Thereafter, electric power is supplied from the direct current power source 126 to the conductor film 111 for adsorbing the wafer 109 such that the potential is opposite to that during processing, after electricity elimination processing of an electrostatic adsorption force is performed, rare gas is introduced into the processing chamber 104 and is replaced with the processing gas, and after the wafer 109 is lifted from the placement surface 120a of the wafer placement electrode 120 by the lift pin, the wafer 109 is delivered to the tip end of the arm of the transfer robot that has entered the processing chamber 104 through the gate opened by the gate valve, and is carried out of the processing chamber 104 by the contraction of the arm. If there is another wafer 109 to be processed, the wafer 109 is carried in by the transfer robot and is processed in the similar manner as above, and if there is no other wafer 109, the gate valve airtightly closes the gate, the processing chamber 104 is sealed, and the processing in the processing chamber 104 is completed.

Then, in the plasma etching apparatus 100 of the present embodiment, during the processing of the wafer 109, the second radio frequency power is supplied from the radio frequency power source 127, which is the second radio frequency power source, to a conductor ring 131 disposed between the recessed portion 120d on the outer periphery of the placement surface 120a of the wafer placement electrode 120 and the susceptor ring 113. Further, the conductor ring 131 forms a power supply path of the second radio frequency power, is disposed in a through hole penetrating inside of an outer peripheral portion of the electrode base material 108 of the wafer placement electrode 120, and is connected to a power supply connector 161 that is pressed upward from below against the conductor ring 131 and is held on the conductor ring 131.

The radio frequency power output from the radio frequency power source 127 is supplied to the conductor ring 131, which is made of a conductor and disposed on an inner side of the susceptor ring 113, on the power supply path that electrically connects the radio frequency power source 127 and the conductor ring 131 via the load matching device 128 and the load impedance variable box 130 which are placed on the power supply path. At this time, impedance on the power supply path is adjusted to a value within a suitable range in the load impedance variable box 130, so that a value of the impedance for the first radio frequency power from the radio frequency power source 127 to an outer peripheral edge portion of the wafer 109 through the electrode base material 108 is relatively low with respect to a portion having relatively high impedance on an upper portion of the susceptor ring 113. Accordingly, the radio frequency power is effectively supplied to the outer peripheral side portion and the outer peripheral edge portion of the wafer 109, concentration of an electric field on the outer peripheral side portion or the outer peripheral edge portion of the wafer 109 is reduced, a distribution of heights of equipotential surfaces of bias potentials above these regions is set within a desired range in which variations in an incidence direction of charged particles such as ions in the plasma on the upper surface of the wafer 109 are allowed, and a processing yield is improved.

In the present embodiment, the radio frequency power source 127 is electrically connected to the grounding portion 112. In the present embodiment, a frequency of the second radio frequency power supplied to the conductor ring 131 from the radio frequency power source 127 is appropriately selected according to processing conditions of the wafer 109, and is preferably the same as or a constant multiple of that of the radio frequency power source 124.

Next, with reference to FIG. 2, details of a configuration of the susceptor ring 113 surrounding the upper portion of the wafer placement electrode 120 and the conductor ring 131 inside the susceptor ring 113 according to the present embodiment will be described. The parts having the same reference numerals as those shown in FIG. 1 in this figure are omitted unless necessary. FIG. 2 is a cross-sectional view schematically showing an enlarged configuration of a portion of the susceptor ring of the sample stage of the plasma processing apparatus shown in FIG. 1.

The wafer placement electrode 120 of the present embodiment includes the electrode base material 108 having a cylindrical or disc shape, the insulating plate 150 which has a disc shape and is disposed on the lower surface of the electrode base material 108 and connected to the electrode base material 108, and a grounding plate 151, which is a disc-shaped member made of a conductor and placed below a lower surface of the insulating plate 150 so as to abut on the insulating plate 150 and has a grounding potential. Further, in the wafer placement electrode 120, the electrode base material 108, the insulating plate 150, and the grounding plate 151 are integrally fastened with bolts (not shown) or the like.

Further, the grounding plate 151 is placed on an upper end surface of a cylindrical portion of an electrode base 146 whose lower surface of an outer peripheral end has a cylindrical shape, with a sealing member 145 such as an O-ring sandwiched between the grounding plate 151 and the electrode base 146, and is fastened with bolts (not shown) in this state. With this configuration, a space 149 below the grounding plate 151 and on a central side of the electrode base 146 is airtightly sealed with respect to the processing chamber 104 outside the wafer placement electrode 120, communicates with the outside of the vacuum container 101 via a connecting path (not shown), and is maintained at an atmospheric pressure or a pressure close to the atmospheric pressure during the processing of the wafer.

In the present embodiment, the power supply connector 161 is fitted and disposed inside a through hole 120c, which penetrates the electrode base material 108, the insulating plate 150 below the electrode base material 108, and the grounding plate 151, and a through hole 139a, which is formed in a ring-shaped insulating ring 139 made of an insulator or a dielectric. The through hole 120c is a cylindrical hole having an opening on the upper surface of the recessed portion 120d disposed in a ring shape on an outer peripheral side of a cylindrical protruding portion in a central portion on which the wafer 109 is placed on the upper portion of the electrode base material 108. Further, the through hole 139a is a cylindrical hole formed in the ring-shaped insulating ring 139 made of an insulator or a dielectric forming the susceptor ring 113 placed on the recessed portion 120d, and a shaft is disposed at a position concentric with or close to a position concentric with the through hole 120c. The insulating ring 139 is a ring-shaped member having a predetermined thickness and having a flat upper surface, and has a dimension and a shape disposed at a position concentric with or close to a position concentric with a cylindrical protruding portion having the placement surface 120a on the central portion of the electrode base material 108.

The conductor ring 131 is a ring-shaped member, which is made of a conductor such as metal such as aluminum or an alloy thereof and has flat upper and lower surfaces and has a predetermined thickness, and, similar to the insulating ring 139, is a member that surrounds the cylindrical protruding portion on the central portion of the electrode base material 108. The conductor ring 131 may be a member made of a conductor having a film whose surface has insulation. In the present embodiment, the conductor ring 131 will be described assuming that a titanium member is used as a base material and the surface thereof is coated with a material having high plasma resistance such as ceramics by a method such as thermal spraying.

The conductor ring 131 is disposed between the recessed portion 120d, which is disposed in a ring shape on an outer peripheral side portion of the upper portion of the electrode base material 108 having a cylindrical shape or a disc shape and surrounds a central side portion of the upper portion, and the susceptor ring 113 placed on the recessed portion 120d, and is disposed on the susceptor ring 113 so as to surround an upper surface, an inner periphery, and an side surface of an outer peripheral side. Further, the conductor ring 131 is connected to the radio frequency power source 127 via the matching device 128 and the load impedance variable box 130 by the power supply path passing through the inside of the electrode base material 108, the second radio frequency power is supplied from the radio frequency power source 127 during the processing of the wafer 109, and an electric field having a distribution corresponding to a difference from the potential of the plasma 116 inside the processing chamber 104 and an equipotential surface depending on the electric field are formed above the upper surface of the wafer 109 and the upper surface of the susceptor ring 113 formed parallel to or flat enough to be regarded as parallel to the upper surface of the wafer 109.

Further, as a member forming the power supply path for supplying the radio frequency power for bias formation to the conductor ring 131, the power supply connector 161, which is made of a conductor and is disposed so as to penetrate the wafer placement electrode 120 up and down, is provided below the conductor ring 131 and is connected to the lower surface of the conductor ring 131. A power supply boss 133, which has a cylindrical shape and forms an upper end portion of the power supply connector 161, and the conductor ring 131 are fastened by a fastening screw 132, which is a screw or a bolt screwed into a female screw hole disposed in an upper surface of a cylindrical portion on an upper end portion of the power supply boss 133, through a through hole formed in the conductor ring 131 from above the conductor ring 131. By fastening with the fastening screw 132, surfaces of the two members of the conductor ring 131 and the power supply boss 133 of the power supply connector 161 are in contact with each other and are electrically connected to each other by the radio frequency power.

The power supply connector 161 includes: the power supply boss 133, which is a rod-shaped member whose axis extends in the upper-lower direction and has a cylindrical shape and is made of a conductor such as metal; a beam-shaped member 135, which is fastened to a lower end of the power supply boss 133 with a fastening screw 163 made of a conductive member and has a rectangular plane shape and is made of a conductor whose upper surface is connected to a lower surface of the lower end; and a fastening screw 162, which is a male screw or a bolt screwed into a connecting column 147 which has a cylindrical shape and is connected to the lower surface of the beam-shaped member 135 below the other end portion of the beam-shaped member 135 and screwed into a female screw hole disposed in a lower surface of the connecting column 147 with a metal terminal forming an end portion of a cable for supplying the radio frequency power sandwiched between the female screw hole and the fastening screw 162. For the beam-shaped member 135, one end portion of a plate-shaped portion whose plane shape is rectangular is connected to a lower surface of a lower end portion of the power supply boss 133 having a cylindrical shape, and the other end portion of the plate-shaped portion is connected to an upper surface of a cylindrical portion of the connecting column 147, which is a metal member such as aluminum or copper, by the fastening screw 163 which is a screw or a bolt (the fastening screw 163 at the other end portion is not shown).

With this configuration, a terminal of the cable for supplying the radio frequency power is electrically connected to the conductor ring 131 through the power supply connector 161, which includes the connecting column 147, the beam-shaped member 135, and the power supply boss 133, and the fastening screw 132. Further, when the terminal is connected to the conductor ring 131, an upper end portion of the power supply boss 133 is disposed in a through hole that penetrates the insulating ring 139 up and down, and further the power supply boss 133 is disposed so as to penetrate the inside of a cylindrical insulating boss 144 inside a through hole disposed through the electrode base material 108, the insulating plate 150 disposed below the lower surface of the electrode base material 108, and the grounding plate 151 below the lower surface of the insulating plate 150, and a cylindrical lower end portion of the power supply boss 133 is exposed in the space 149 (or a space communicating with the space 149) below the insulating boss 144. The power supply boss 133 is held at the upper end portion by placing the conductor ring 131 connected by the fastening screw 132 at the upper end portion to abut on an upper surface of the insulating ring 139, and is suspended and held on an inner side of the through hole.

The connection between the beam-shaped member 135 formed by the plate-shaped portion and the power supply boss 133 and the connection between the beam-shaped member 135 and the connecting column 147 may be electrical connection by joining such as welding in addition to fastening with screws or bolts. In the present embodiment, a height position of an upper surface of one end portion of the beam-shaped member 135 is held so as to be located below an upper surface of the other end portion of the beam-shaped member 135, which is connected to the upper end of the connecting column 147 and whose position at least in the upper-lower direction is fixed. Therefore, the beam-shaped member 135 is held in a state where one end portion side of the plate-shaped portion extending in a horizontal direction from the other end portion is bent downward, and the power supply connector 161 is mounted on the lower portion of the wafer placement electrode 120 such that a reaction force acts as a leaf spring that pushes the one end portion upward against the lower end portion of the power supply boss 133.

Further, in the upper-lower direction of the beam-shaped member 135, gaps that allow deformation and displacement due to bending of the beam-shaped member 135 are provided between inner surfaces of an internal space of a guide member 148 that faces and surrounds the upper and lower surfaces of the beam-shaped member 135, so that even when the power supply boss 133 connected to one end portion is deformed such as expanded and contracted due to a change in temperature and the lower end portion is displaced in the upper-lower direction due to the deformation (at least one of these is shown by P in the figure), according to these, the position of the one end portion can be displaced without contacting the guide member 148 to apply a repulsive force to the power supply boss 133. That is, at least the plate-shaped portion of the beam-shaped member 135 is a plate-shaped member having elasticity or rigidity sufficient to exert the above operation.

The lower end portion of the power supply boss 133, the beam-shaped member 135, the connecting column 147, and the fastening screws 162, 163 are disposed in a space inside the guide member 148. The guide member 148 is disposed in the space 149 below the grounding plate 151 in a state where the grounding plate 151 is placed above the upper end portion of the electrode base 146, and is mounted in a recessed portion whose thickness is reduced by being recessed upward in the figure on a lower surface of the grounding plate 151, and the position of the guide member 148 is fixed. The guide member 148 is housed with a gap, which has a predetermined distance where the guide member 148 is allowed to be deformed, is opened from an inner wall surface in a space inside a metal member having an inverted L-shaped vertical cross section in the figure so that the beam-shaped member 135 does not come into contact with the inner side wall surface of the space. The guide member 148 has a first space having a rectangular plane shape when viewed from above the wafer placement electrode 120 and has a cylindrical second space in which the guide member 148 extends in the upper-lower direction below the other end portion of the beam-shaped member 135 in a state where the beam-shaped member 135 is housed and the connecting column 147 and the fastening screw 162 are disposed inside the second space. Although not shown, in a state where the beam-shaped member 135 is housed inside the first space, a cylindrical through hole, which extends in the upper-lower direction below the other end portion of the beam-shaped member 135 connected to the lower end portion of the power supply boss 133 and communicates with the space 149, is provided, and the fastening screw 163 faces the space 149 through the through hole in a state where the fastening screw 163 is mounted on the power supply connector 161. The through hole is configured such that an operator below the space 149 can remove the fastening screw 163 from the power supply connector 161 or conversely mount the fastening screw 163 on the power supply connector 161.

The lower end portion of the cylindrical second space inside the guide member 148 has an opening at the lower end portion of the guide member 148, and the opening is closed by mounting a lid member 164 on the lower end portion of the guide member 148. The lid member 164 is connected to the guide member 148 using screws or bolts. A central portion of the lid member 164 has a through hole through which the end portion or the terminal of the cable forming the power supply path for the radio frequency power from the radio frequency power source 127 connected to the connecting column 147 by the fastening screw 162 passes.

In a state where the lid member 164 is mounted on the guide member 148, the lower surface of the fastening screw 162 fastened to the lower end portion of the connecting column 147 connected to the other end portion of the beam-shaped member 135 is in contact with a surface (an upper surface in the figure) facing the second space. That is, in a state where the power supply connector 161 is fastened to the conductor ring 131 by the fastening screw 132, and is housed in the first and second spaces inside the guide member 148 closed by the lid member 164, a state is obtained in which the fastening screw 162 and the connecting column 147 abut on the lid member 164 and are supported upward from the lower side, and the upper surface of the other end portion of the beam-shaped member 135 connected to the upper end of the connecting column 147 is higher than the upper surface of one end portion of the beam-shaped member 135 connected to the lower end of the power supply boss 133.

In this state, the beam-shaped member 135 is bent such that one end portion of the plate-shaped portion connected to the lower end of the power supply boss 133 by the fastening screw 163 is located lower in a height direction as compared with this end portion in a state where no external force other than gravity is applied before mounting, and the reaction force due to the bending of the beam-shaped member 135 as the leaf spring acts on the conductor ring 131 against the power supply boss 133 in direction of being pressed upward. Then, as a reaction to this, the lower end portion of the connecting column 147 integrally connected to the other end portion of the beam-shaped member 135 integrally connected to the fastening screw 162 and the fastening screw 162 are the result of the reaction force from the beam-shaped member 135 acting in a direction of being pressed downward against the lid member 164.

In this way, downward movement of the lower end portion of the power supply connector 161 is prevented by the lid member 164, and the position of the other end portion of the beam-shaped member 135 is fixed by a downward external force. That is, the beam-shaped member 135 operates as a plate-shaped spring or a beam-shaped spring whose position is fixed at the other end portion in response to the deformation of the power supply boss 133 or the displacement of the lower end portion thereof, and an upward reaction force is applied to the conductor ring 131 from one end portion that is bent downward from the position where no external force is applied to the fixed other end portion and a position of which is pushed down. In the present embodiment, even if the power supply boss 133 is displaced or deformed during the processing of the wafer 109, shapes, dimensions, and materials of the power supply boss 133 and the beam-shaped member 135 are selected such that the deformation of the one end portion of the beam-shaped member 135 and an upward spring force are always generated and electrical connection between the conductor ring 131 and the power supply boss 133 is maintained.

In the inner side of the through hole 120c that penetrates the electrode base material 108, the insulating plate 150 below the electrode base material 108, and the grounding plate 151, the cylindrical insulating boss (cylindrical member) 144 made of an insulating material is fitted so that a wall surface of an outer periphery of the insulating boss 144 abuts on a peripheral wall surface of the through hole 120c. Further, the power supply boss 133 is inserted and housed in a space 141 inside the insulating boss 144 with a gap, and is insulated between the electrode base material 108 outside the insulating boss 144 and the grounding plate 151. Further, an O-ring 134 is disposed between and sandwiched by an outer peripheral side wall of the power supply boss 133 and an inner peripheral side wall of the insulating boss 144, and seals between a space 141 inside the power supply boss 133 on the lower portion and a space on the upper portion. For the rod-shaped power supply boss 133, a diameter of an intermediate portion between the upper end portion and the lower end portion having a cylindrical shape is smaller than those of the upper end portion and the lower end portion, and a gap from the insulating boss 144 is increased.

Further, in the present embodiment, in a state where the power supply boss 133 is placed on the insulating ring 139, the position of the power supply boss 133 is fixed and mounted on the electrode base material 108 to assemble the power supply connector 161, and the lid member 164 is mounted on the lower end of the guide member 148, an upward force caused by the beam-shaped member 135 connected to the connecting column 147 and the power supply boss 133 and bending downward acts on the power supply boss 133. The present embodiment is not limited to such a configuration, and may be a configuration in which, in a state where the lid member 164 is mounted on the guide member 148 in a process in which the power supply connector 161 is assembled and mounted on the electrode base material 108, the lower end of the fastening screw 162 is not in contact with the lid member 164, the power supply connector 161 is positioned with respect to the electrode base material 108 and is held and suspended at the upper end portion inside the through hole 120c, and when the wafer placement electrode 120 including the electrode base material 108 is deformed by the heat generated during the processing of the semiconductor wafer 109 or the power supply boss 133 is heated and expanded, the beam-shaped member 135 and the connecting column 147 move downward relatively, as a result, the lower end of the fastening screw 162 abuts on the lid member 164 to prevent downward displacement, and the position of the lower end of the power supply connector 161 is fixed.

In the present embodiment, the O-ring 134, which is a sealing portion, airtightly seals a space, which communicates with the processing chamber 104 above the O-ring 134 on the upper portion of the insulation boss 144 or the through hole 120c, and the space 141, which is inside the insulating boss 144 and between the insulating boss 144 and the power supply boss 133. Accordingly, in the space 141 which communicates with the space 149 in the lower portion of the insulating boss 144 or the power supply boss 133 and is maintained at a pressure the same as the atmospheric pressure or close to the atmospheric pressure, positions where the members forming the power supply connector 161 such as the power supply boss 133, the thin plate 135, and the connecting column 147 come into contact with each other are disposed inside an airtight space, and corrosion of these members or generation of reactants, which is caused by highly reactive particles in the processing chamber 104 entering the space, and deterioration of electrical connection performance due to alteration of these members are prevented.

Further, it is possible to prevent the result of the processing on the outer peripheral portion of the wafer 109 from being out of an allowable range from an intended value because the heat from the conductor ring 131 to be heated by being supplied with radio frequency power is promoted to be transferred to the inside of the spaces 141, 149, and the temperature of the susceptor ring 113 rises more than necessary.

As shown in FIG. 2, the power supply connector 161 of the present embodiment is disposed in the space below the grounding plate 151 below the through hole 120c, one end portion of a plate-shaped or beam-shaped portion extending in the horizontal direction is connected to the lower end of the power supply boss 133 made of a conductor, and a beam-shaped member 135 is provided as a part of the power supply path as a beam-shaped member having a fixed end whose other end portion is fixed to the grounding plate 151 or the wafer placement electrode 120. As described above, the beam-shaped member 135 is a plate-shaped member having a rectangular shape when viewed from above the wafer placement electrode 120, and bends and deforms in the upper-lower direction (arrow P in FIG. 2) according to an external force received by the one end portion thereof.

Then, the connecting column 147 made of a conductor is connected to and disposed below the lower surface of the other end portion of the beam-shaped member 135 facing the beam-shaped member 135 in a longitudinal direction. Due to the change in the shape of the through hole 120c caused by the distortion of the wafer placement electrode 120 during the processing of the wafer 109, particularly the change in a length of the power supply path in the upper-lower direction in the through hole 120c, in response to fluctuations in a position of the lower end of the power supply boss 133, which is suspended and held from the upper end whose position is fixed to the upper surface above the upper surface of the recessed portion 120d, one end portion of the beam-shaped member 135 having elasticity bends following displacement of a connection position with the power supply boss 133 to generate an upward reaction force as a spring, and a desired supply of radio frequency power to the conductor ring 131 is maintained. Then, since the lower portion of the power supply connector 161 is disposed inside the space 141, 149 at the atmospheric pressure, the heat transfer performance of the beam-shaped member 135 made of metal is maintained high, and an excessive rise in the temperature of the conductor ring 131 can be prevented.

Further, the temperature of the member rises due to radio frequency induction heating caused by the radio frequency power applied to the power supply connector 161 and the member thermally expands, so that the power supply connector 161 and structures adjacent to the power supply connector 161 may be damaged. The beam-shaped member 135 and the connecting column 147 are disposed in the space connected to the space 149, and by applying a film made of a conductor such as gold plating in consideration of a metal member having a low resistivity and a skin effect, it is possible to reduce the resistance of the conductor and prevent the temperature rise.

On the other hand, the power supply boss 133 is in contact with both the space 141 and the processing chamber 104, which are supplied with radio frequency power and exposed to the atmospheric pressure. Therefore, in order to prevent contamination caused by an interaction from the processing chamber 104, it is necessary to appropriately select a base material having high plasma resistance while maintaining conductivity and a material for a film formed on the base, but options for such materials are limited. Therefore, it may be difficult for the power supply boss 133 to reduce the resistivity, which may cause a large thermal expansion.

In the present embodiment, even when the lower end of the power supply boss 133 thermally expands in the upper-lower direction, for the beam-shaped member 135 whose one end portion is connected to the lower end portion of the power supply boss 133, the fastening screw 162 at the lower end portion of the connecting column 147 connected to the other end portion of the beam-shaped member 135 abuts on the lid member 164 and the other end portion is hindered from moving in the height direction, so that the position in the upper-lower direction is fixed. Therefore, as the one end portion is displaced downward, the rectangular plate-shaped portion of the beam-shaped member 135 bends downward and deforms while pressing the upper end portion of the power supply boss 133 against the conductor ring 131, and the connection between the beam-shaped member 135 and the power supply boss 133 is maintained. The guide member 148, in which the beam-shaped member 135 is housed inside the first space, has a dimension having a sufficient distance from the surface of the beam-shaped member 135 such that contact between the beam-shaped member 135 deformed in the above way and an inner side wall is unlikely to occur. Accordingly, it is possible to prevent the power supply connector 161 and the structures adjacent to the power supply connector 161 from coming into contact with the power supply connector 161 and damaging any one of the power supply connector 161 and the structures.

For example, the material of the power supply boss 133 is SUS304, the power supply boss 133 has a cylindrical shape at the upper and lower end portions whose diameter is larger than that of the intermediate portion, and a length between the upper end and the lower end is 100 mm. When the temperature reaches 200° C. due to the supply of the radio frequency power, the upper end of the power supply boss 133 is connected to the conductor ring 131 and the position in the upper-lower direction is fixed, so that the lower end of the power supply boss 133 extends downward by about 0.5 mm. In this case, in a state where the beam-shaped member 135 is housed in the first space of the guide member 148, the first space is disposed such that the lower surface and the upper surface of the inner side wall surface can be separated from the upper and lower surfaces of the beam-shaped member 135 by a distance of 0.5 mm or more. Therefore, even if the beam-shaped member 135 is bent and displaced in the upper-lower direction, the power supply boss 133 and the beam-shaped member 135 are prevented from coming into contact with other members or being damaged by the contact.

Further, the plasma etching apparatus 100 of the present embodiment includes a configuration in which, gaps between the members to open an appropriate distance are disposed in the power supply path of the radio frequency power supplied to the conductor ring 131 via the power supply connector 161, in particular, inside the wafer placement electrode 120, so that the distance through which a radio frequency current flows is increased to prevent the occurrence of short circuits. Further, the power supply boss 133, the thin plate 135, the conductive member 147, or the like inside the space 141 at the atmospheric pressure promote heat transfer to the electrode base material 108 via gas at the atmospheric pressure, and it is possible to prevent excessive temperature rise of the power supply connector 161 or the conductor ring 131 and the susceptor ring 113.

Then, the beam-shaped member 135 uses, for example, brass as a material, and the surface of the plate material is gold-plated in order to reduce skin resistance of the radio frequency current. General stainless steel, titanium, or aluminum that can maintain elasticity may be used.

Further, the thickness of the beam-shaped member 135 is set to a size of a skin depth×2 with respect to the radio frequency current having a predetermined frequency, so that the efficiency of transmitting the current can be maximized. Here, in the present embodiment in which 400 kHz is used as the frequency of the radio frequency power, the skin depth is calculated to be 0.1 mm with gold. Therefore, it is most preferable to manufacture the plate having a thickness of 0.1 mm×2=0.2 mm. Considering limits of a tolerance and an accuracy on manufacturing, the thickness of the plate is preferably about 0.1 to 1.0 mm.

The dielectric susceptor ring 113 of the present embodiment may be formed by at least two members. For example, the susceptor ring 113 is placed on the recessed portion 120*d* on the outer peripheral side of the protruding portion of the electrode base material 108, and includes a dielectric upper susceptor ring 137, which is disposed so as to cover the upper surface and the inner and outer peripheral surfaces of the conductor ring 131 with a gap from the surfaces, and the dielectric insulating ring 139, which is placed below the upper susceptor ring 137 so as to be covered by the upper susceptor ring 137 and on which the conductor ring 131 is placed. For the insulating ring 139 and the conductor ring 131 placed above the upper surface of the insulating ring 139, the upper surfaces and the side wall surfaces of the inner peripheral sides and the outer peripheral sides of the insulating ring 139 and the conductor ring 131 are respectively covered by the upper portion, the inner peripheral side portion, and the outer peripheral side portion of the upper susceptor ring 137, and are built in the inner side of the upper susceptor ring 137.

The susceptor ring 113 may be a member which is not divided into a plurality of members but is integrally connected, and the conductor ring 131 may be disposed inside the integrated susceptor ring 113. For example, diffusion bonding or integral sintering of quartz may be used with the conductor ring 131 sandwiched between two quartz members.

Next, a configuration of another portion of the susceptor ring 113 according to the present embodiment will be described with reference to FIG. 3. FIG. 3 is a cross-sectional view schematically showing an enlarged configuration of another portion of the susceptor ring of the plasma processing apparatus according to the present embodiment shown in FIG. 2.

In the configuration shown in FIG. 3, in order to place the conductor ring 131 on the recessed portion 120*d* of the outer peripheral side portion on the upper portion of the electrode base material 108 and fix the position of the conductor ring 131, the conductor ring 131 is fastened to the electrode base material 108 by an insulating screw 136 inserted through both a through hole 131*b* disposed inside the conductor ring 131 and a through hole 139*d* disposed inside the insulating ring 139. Further, the through hole 131*b* of the conductor ring 131 is formed by an insulating sleeve 142 disposed inside the conductor ring 131. Upper and lower surfaces of the insulating sleeve 142 are in continuous contact with an insulating film 143 applied to the outer surface of the conductor ring.

Accordingly, since the conductor ring 131 and the through hole 131*b* are electrically insulated, and there is no creeping distance electrically connected between the conductor ring 131 and the electrode base material 108, it is possible to prevent creeping discharge. The insulating sleeve 142 is formed using, for example, a sintered body made of ceramics as a material and the related art such as a thermal spraying method for forming a film.

Further, a bottom surface of a portion of the upper susceptor ring 137 forming the side wall of the inner peripheral side having a cylindrical shape has a contact surface 138 on which the portion is in contact with and abuts on the ring-shaped recessed portion 120*d* surrounding the placement surface 120*a* of the electrode base material 108. The contact surface 138 of the upper susceptor ring 137 and the upper surface of the recessed portion 120*d* of the electrode base material 108 come into contact with each other, and thus an interaction between highly reactive particles of the plasma 116, which are formed inside the processing chamber 104, and the surface of the conductor ring 131 housed inside the upper susceptor ring 137 is prevented by partitioning the surface of the conductor ring 131 from the processing chamber 104, and reactants from the outer peripheral edge portion of the wafer 109 and the inside of the plasma 116 are prevented from adhering to the surface of the conductor ring 131.

According to the above embodiment, since the power supply connector 161 is provided in the power supply path for the radio frequency power connected to the conductor ring 131, the impedance of the power supply path of the radio frequency power supplied to the conductor ring 131, which is disposed inside the susceptor ring 113 and supplied with the radio frequency power, can be reduced, and the power supply path, particularly the power supply connector 161 inside the electrode base material 108 can be efficiently cooled. Further, the deformation of the power supply connector 161 caused by the deformation of the wafer placement electrode 120 or the electrode base material 108 due to heat, sliding with the members, which are disposed in contact with the power supply connector 161 around the power supply connector 161, and progress of failure and wear caused by the sliding is reduced. Accordingly, the reliability and yield of the plasma etching apparatus 100 can be maintained high for a long period of time.

When the conductor ring 131 and insulation ring 139 are replaced for maintenance, by removing the conductive screw 132 that fastens the power supply boss 133 shown in FIG. 2 and the insulating screw 136 shown in FIG. 3, the conductor ring 131 and the insulating ring 139 can be removed from the recessed portion 120*d* of the electrode base material 108. Therefore, the power supply boss 133, the insulating boss 144, and the O-ring 134 shown in FIG. 2 remain disposed in the through hole 120*c*, and it is possible to replace a minimum number of parts.

The embodiment shown in FIGS. 1 to 3 has a configuration in which the radio frequency power from the radio frequency power source 124 is supplied to the electrode base material 108. Instead of the configuration of such an embodiment, a configuration may be provided in which the radio frequency power source 124 is electrically connected to the conductor film 111 inside the dielectric film 140 via the matching device 129 to supply the radio frequency power. A configuration of such a modification will be described with reference to FIG. 4. FIG. 4 is a cross-sectional view schematically showing an enlarged configuration of a portion of a susceptor ring of a sample stage of a plasma processing apparatus according to a modification of the embodiment of the invention shown in FIG. 2.

In the present embodiment, the point that the conductor film 111 disposed inside the dielectric film 140 and the radio frequency power source 124 are electrically connected via the matching device 129, and the point that the electrode base material 108 is electrically connected to the grounding portion are different in configuration from that of the embodiment shown in FIG. 2. The other configurations shown in FIG. 4 are the same as those of the embodiment shown in FIG. 2, and the description of the parts having the same reference numerals will be omitted. Even in such a configuration, if a withstand voltage to the grounding portion is guaranteed, operations and effects similar to those of the embodiment can be obtained.

Another modification of the embodiment will be described with reference to FIG. 5. FIG. 5 is a cross-sectional view schematically showing an enlarged configuration of a portion of a susceptor ring of a sample stage of a plasma processing apparatus according to another modification of the embodiment shown in FIG. 2. In this figure, the description of the parts with the same reference numerals as those in the embodiment will be omitted unless otherwise required.

The difference between the modification shown in this figure and the embodiments shown in FIGS. 2 and 4 is that, instead of the beam-shaped member 135 provided in the power supply connector 161, a stranded wire conductive member 153 formed by twisting a plurality of cables made of a conductive material such as metal is disposed so as to connect the upper end portion of the connecting column 147 and the lower end portion of the power supply boss 133. Configurations other than the stranded wire 153 of the present embodiment are the same as those of the embodiment shown in FIG. 2.

For example, austenitic SUS304-CSP is used as the material of the stranded wire 153 according to the modification, and a surface of each lead wire is tin-plated in order to reduce the skin resistance to the radio frequency power. The material may be general stainless steel, titanium, aluminum, or copper.

Further, when a diameter of an assembled wire of the stranded wire 153 is the skin depth×2, the current transmission is most efficient. In the present embodiment, since the radio frequency power supplied to the conductor ring 131 uses a frequency of 400 kHz, the skin depth of tin with respect to the frequency is 0.3 mm. Therefore, an assembled diameter of the stranded wire 153 is preferably 0.3 mm×2=0.6 mm or more. Considering the tolerance and the accuracy on manufacturing, the assembled diameter of the stranded wire 153 is preferably about 0.6 to 10 mm. The assembled diameter of the stranded wire 153 represents a diameter of a portion where the diameter of the assembled stranded wire 153 is the largest.

Further, similar to the embodiment in FIG. 4, in the modification shown in FIG. 5, instead of the configuration in which the radio frequency power from the radio frequency power source 124 is supplied to the electrode base material 108, a configuration may be provided in which the radio frequency power source 124 is electrically connected to the conductor film 111 inside the dielectric film 140 via the matching device 129 to supply the radio frequency power. Such a modification will be described with reference to FIG. 6. FIG. 6 is a cross-sectional view schematically showing an enlarged configuration of a portion of a susceptor ring of a sample stage of a plasma processing apparatus according to a further modification of the embodiment shown in FIG. 2.

In the present embodiment, similar to the modification shown in FIG. 5, the power supply connector 161 has a configuration in which the stranded wire conductive member 153 formed by twisting a plurality of cables made of a conductive material such as metal is disposed so as to connect the upper end portion of the connecting column 147 and the lower end portion of the power supply boss 133. On the other hand, the modification in FIG. 5 has the configuration in which the radio frequency power source 124 is electrically connected to the electrode base material 108 via the matching device 129, and the first radio frequency power is supplied to the electrode base material 108, whereas similar to the modification shown in FIG. 4, the embodiment in FIG. 6 is different from the modification of FIG. 5 in configuration that the conductor film 111 disposed inside the dielectric film 140 and the radio frequency power source 124 are electrically connected via the matching device 129, and the electrode base material 108 is electrically connected to the grounding portion. Even in the configuration of the present embodiment, if a withstand voltage to the grounding portion is guaranteed, operations and effects similar to those in the form of FIG. 5 can be obtained.

In the above embodiment, the power supply boss 133 and the O-ring 134 fitted around the power supply boss 133 are inserted into the cylindrical insulating boss 144 inserted in the through hole 120*c*, and the upper end portion of the power supply boss 133 is fastened to the conductor ring 131 above the insulating ring 139 so that the position of the power supply boss 133 in the upper-lower direction and a left-right direction is fixed. On the other hand, in the above embodiment, the power supply boss 133 and the O-ring 134 are inserted into the insulating boss 144 during assembly, and the position of the insulating boss 144 in which the O-ring 134 and the inner peripheral wall surface are in contact with each other easily moves in the upper-lower direction in the through hole 120*c*.

In such a state, for example, in FIG. 2, if an unnecessarily large gap is generated between the upper surface of the electrode base material 108 on which the insulating ring 139 is placed and the upper end of the insulating boss 144 inserted into the through hole 120*c*, during the processing of the semiconductor wafer 109, which is performed by supplying an electric field into the processing chamber 104 to form plasma and supplying the radio frequency power to the electrode base material 108, an unexpected discharge may occur in a gap between a lower surface of the insulating ring 139 and the upper end surface of the insulating boss 144.

Such an abnormal discharge changes a distribution of the plasma 116 above the upper surface of the semiconductor wafer 109 from an intended distribution, which may adversely affect the result of the processing, so that the above state is not preferable. In order to prevent the abnormal discharge, a configuration for keeping the above gap within an allowable range is required.

Second Embodiment

Another embodiment of the invention having such a configuration will be described later with reference to FIGS. 7 to 10. FIG. 7 is a cross-sectional view schematically showing an enlarged configuration of a portion of a susceptor ring of a sample stage of a plasma processing apparatus according to another embodiment of the invention. The parts having the same reference numerals as those shown in FIGS. 1 to 6 in this figure are omitted unless necessary.

In the embodiment shown in this figure, the configuration different from the embodiment shown in FIG. 2 is that a spacer 165 made of an insulating material or a dielectric and having a cylindrical or ring shape is provided between the upper end portion of the insulating boss 144 and the lower surface of the insulating ring 139. In the present embodiment, the upper end portion of the insulating boss 144 having a cylindrical shape has a recessed portion recessed by a predetermined length in the height direction over the entire periphery of the outer peripheral side portion. Further, the insulating ring 139 includes a recessed portion, which is recessed by a predetermined length in the height direction over the entire periphery of the inner peripheral wall surface, in a lower end portion of the through hole 139a.

The spacer 165 having a ring shape having a value of an inner diameter equal to or close to that of an inner diameter of the insulating boss 144 and a diameter of the through hole 139a is fitted into the recessed portions of the insulating boss 144 and the insulating ring 139. That is, the spacer 165 having a cylindrical shape of the present embodiment has a value of an outer diameter equal to or close to that of a diameter of the lower portion of the insulating boss 144, a lower end portion of an inner peripheral wall of the spacer 165 has a recessed portion having a length equal to or close to that of the recessed portion at the upper end portion of the insulating boss 144 in the height direction, and an outer peripheral side portion of the recessed portion at a lower end portion of the spacer 165 is a ring-shaped protruding portion protruding upward when viewed from the recessed portion. The protruding portion is inserted into a ring-shaped gap between the recessed portion at the upper end portion of the insulating boss 144 and the inner peripheral wall surface at the upper end portion of the cylindrical through hole 120c of the electrode base material 108, and is supported by being placed on the upper end of the insulating boss 144 in a state where the protruding portion and the recessed portion are fitted and the spacer 165 is inserted into the through hole 120c.

Further, a diameter of a cylindrical inner peripheral surface of the spacer 165 has a value equal to or close to that of a diameter of an upper portion of the through hole 139a, an upper end portion of the spacer 165 has a recessed portion having a length equal to or close to that of the recessed portion of the insulating ring 139 in the height direction over the entire periphery of the outer peripheral side portion. An inner peripheral side portion of the recessed portion at the upper end portion of the spacer 165 is a ring-shaped protruding portion protruding upward when viewed from the recessed portion. In a state where the insulating ring 139 is placed on the upper surface of the recessed portion 120d of the electrode base material 108, the upper end portion of the spacer 165 placed above the upper end of the insulating boss 144 is inserted into the through hole 139a, and the ring-shaped protruding portion of the spacer 165 is inserted and fitted into a gap between an outer peripheral side wall surface of the upper end portion of the power supply boss 133 having a cylindrical shape and a cylindrical inner peripheral side wall surface of the ring-shaped recessed portion at the lower end portion of the through hole 139a of the insulating ring 139.

In this state, between the recessed portion at the lower end portion of the through hole 139a of the insulating ring 139 and the recessed portion at the upper end portion of the spacer 165, and between the recessed portion at the upper end portion of the insulating boss 144 and the recessed portion at the lower end portion of the spacer 165, a slight gap is formed even if there is a contact portion. The gap is a space having a stepped bend in a radial direction (horizontal direction) when viewed in a cross section in the upper-lower direction. By forming a space having such a step between the spacer 165 and the insulating ring 139 and between the spacer 165 and the insulating boss 144, the so-called creeping distance is increased, so that even if the distance between the insulating ring 139 and the insulating boss 144 becomes larger than necessary, the occurrence of abnormal discharge in the gap is prevented.

For the spacer 165 of the present embodiment, a simple substance of ceramics such as aluminum oxide, yttrium oxide, and quartz, or a mixture thereof can be used as a material.

In FIG. 7, a configuration is provided in which the spacer 165 is disposed between the insulating ring 139 and the insulating boss 144, the insulating ring 139 and the insulating boss 144 have ring-shaped recessed portions, a gap having a plurality of steps is formed between the upper and lower members in which the protruding portion and the recessed portion are fitted to each other, and the creeping distance of the discharge due to an electric field generated in the gap is increased. On the other hand, a configuration may be provided, in which without using the spacer 165, each of the insulating ring 139 and the insulating boss 144 is provided with a protruding portion or a recessed portion and is fitted to each other, as the configuration for increasing the creeping distance of the gap between the fitted protruding portion and recessed portion. An example of such a configuration will be described with reference to FIGS. 8 and 9.

Each of FIGS. 8 and 9 is a cross-sectional view schematically showing an enlarged configuration of a portion of a susceptor ring of a sample stage of a plasma processing apparatus according to a modification of the embodiment of the invention shown in FIG. 7. In this figure, a difference in configuration from the embodiment shown in FIG. 7 is that a recessed portion 144a at the upper end portion of the insulating boss 144 and a recessed portion 139b at the lower end portion of the through hole 139a of the insulating ring 139 are fitted to each other, and a gap bent like a step is formed between surfaces of the recessed portion 144a and the recessed portion 139b when viewed in a cross section in a vertical direction.

That is, the insulating boss 144 of the present embodiment is compared with that of the embodiments shown in FIGS. 2 and 7, and the upper end portion of the insulating boss 144 inserted into the through hole 120c is higher that the upper surface of the recessed portion 120d of the electrode base material 108 and protrudes upward from the through hole 120c. The recessed portion 144a is formed on the outer peripheral side wall over the entire outer periphery of the protruding upper end portion. The inner peripheral side of the recessed portion 144a at the upper end portion of the insulating boss 144 is a ring-shaped protruding portion protruding upward when viewed from the recessed portion 144a. When the insulating ring 139 is placed on the recessed portion 120d, the protruding portion is inserted and fitted into a ring-shaped gap between the inner peripheral side wall surface of the recessed portion at the lower end portion of the through hole 139a of the insulating ring 139 and the outer peripheral wall surface of the upper end portion of the power supply boss 133 having a cylindrical shape.

On the other hand, in the embodiment shown in FIG. 9, the insulating ring 139 has a ring-shaped protruding portion 139c protruding downward from a bottom surface, and an inner peripheral wall surface of the ring-shaped protruding portion 139c has a diameter equal to or close to that of the through hole 139a. Further, the protruding portion 139c has the protruding portion 139b over the entire periphery at the lower end portion of the inner peripheral wall surface, and the insulating ring 139 is inserted into the through hole 120c in a state where the insulating ring 139 is placed on the recessed portion 120d of the electrode base material 108.

A portion on the outer peripheral side of the protruding portion 139b at the lower end portion of the ring-shaped protruding portion 139c is a ring-shaped protruding portion protruding downward when viewed from the protruding portion 139b, and is inserted into the ring-shaped gap between the outer peripheral side wall surface of the ring-shaped recessed portion 144a at the upper end portion of the inner insulating boss 144 and the inner peripheral side wall surface of the through hole 120c. In a state where the insulation ring 139 is placed on the upper surface of the recessed portion 120d, even if the ring-shaped protruding portion 139c of the insulating ring 139 and the upper end portion of the insulating boss 144 are in contact with each other, a gap is formed between the ring-shaped protruding portion 139c and the upper end portion of the insulating boss 144, and the gap is bent on a step when viewed in a cross section in the upper-lower direction. The plasma processing apparatus 100 of the present embodiment has a similar operation to that of the embodiments shown in FIGS. 7 and 8 in that a creeping distance of discharge due to a radio frequency electric field is increased.

Next, another modification of the present embodiment will be described with reference to FIG. 10. FIG. 10 is a cross-sectional view schematically showing an enlarged configuration of a portion of a susceptor ring of a sample stage of a plasma processing apparatus according to another modification of the embodiment of the invention shown in FIG. 7.

A difference between the configuration of the present embodiment and the configuration of the embodiments shown in FIGS. 7 to 8 is that the inside of the insulating boss 144 has a protruding portion 133a formed on the side wall of the power supply boss 133 and a protruding portion 144b formed on the inner peripheral side wall of the insulating boss 144. Further, a difference is that, in a state where the power supply connector 161 is mounted on the wafer placement electrode 120, the power supply boss 133 is inserted into the through hole 120c, and the upper end portion of the power supply boss 133 is positioned, the protruding portions 133a, 144b are engaged, the protruding portion 144b is placed on the protruding portion 133a, the upper end portion of the power supply boss 133 is fastened to the conductor ring 131, and the power supply boss 133 suspended in the through hole 120c supports the insulating boss 144 upward from below.

That is, the power supply boss 133 of the present embodiment has a cylindrical shape having different diameters at the upper end portion, the lower end portion, and the intermediate portion between the upper end portion and the lower end portion, the upper end portion, the lower end portion, and the intermediate portion have shapes that are disposed concentrically in the upper-lower direction, and dimensions of diameters of the intermediate portion, the lower end portion, and the upper end portion are larger in this order. Further, the protruding portion 133a, which protrudes over an angle range of half a periphery (180°) or less around a central axis in the upper-lower direction of the power supply boss 133, is provided on an outer peripheral side wall of the intermediate portion below a ring-shaped groove, which is formed over the entire periphery of the outer peripheral side wall of the upper end portion and into which the O-ring 134 is fitted. A distance, between a tip end of the protruding portion 133a protruding toward the outer peripheral side and the center of the power supply boss 133 when viewed from above the central axis, is smaller than a radius of the upper end portion (that is, a radius of the inner peripheral side wall of the insulating boss 144) and larger than a radius of the lower end portion.

Further, the protruding portion 144b protruding toward a center side is provided at a portion having a predetermined distance from the upper end or the lower end on the inner peripheral side wall surface of the insulating boss 144 having a cylindrical shape. A distance, between a tip end of the protruding portion 144b protruding toward the center and the center when viewed from above the central axis, is larger than the radius of the lower end portion of the power supply boss 133, and is smaller than the distance between the tip end of the protruding portion 133a of the power supply boss 133 and the center. Further, the protruding portion 144b is disposed over an angle range smaller than the entire periphery of the inner peripheral side wall of the insulating boss 144.

In the present embodiment, in a state where the insulating boss 144 is inserted into the through hole 120c, the insulating ring 139 is placed on the recessed portion 120d, the power supply boss 133 is inserted into the through hole 139a and the insulating boss 144 with the O-ring 134 sandwiched, and the power supply boss 133 is connected to the conductor ring 131 by the fastening screw 132 and the position of the power supply boss 133 is fixed with respect to the electrode base material 108, the protruding portions 133a, 144b are disposed such that heights of the upper surface of the protruding portion 133a and the lower surface of the protruding portion 144b are the same or the upper surface of the protruding portion 133a is slightly lower. That is, by placing the protruding portion 144b above the upper surface of the protruding portion 133a, the insulating boss 144 is supported upward from below by the power supply boss 133. Then, in the present embodiment, in this state, the upper end surface of the insulating boss 144 is disposed at a position that matches the upper surface of the recessed portion 120d or is close to the upper surface of the recessed portion 120d. Further, the lower surface of the insulating ring 139 and the upper end surface of the insulating boss 144 come into contact with each other, or a size of the gap between the lower surface of the insulating ring 139 and the upper end surface of the insulating boss 144 is set to a value within an allowable range that can prevent the occurrence of discharge in the gap.

In order to respectively engage the protruding portions 133a, 144b with the insulating boss 144 and the power supply boss 133 as described above, in a state where the insulating boss 144 is inserted into the through hole 120c, the power supply boss 133 is inserted into the insulating boss 144 together with the O-ring 134. At this time, in a state where the protruding portion 133a of the power supply boss 133 is fitted downward toward the inner peripheral wall surface of the insulating boss 144 in which the protruding portion 144b is not disposed around the central axis, and the protruding portion 133a reaches a position below the protruding portion 144b in the upper-lower direction of the central axis, the power supply boss 133 or the insulating boss 144 is rotated around an axis, and is moved such that the upper surface of the protruding portion 133a is located at a position overlapping a projection range below the lower surface of the protruding portion 144b when viewed from above, preferably located directly below the lower surface of the protruding portion 144b. In this state, the power supply boss is fastened to the conductor ring 131 while forming a seal between the insulating boss 144 and the grounding plate 151 and a seal between the insulating boss 144 another power supply boss 133, so that the position of the insulating boss 144 is determined.

By supporting the protruding portion 144b from below by the protruding portion 133a, it is prevented that the position of the insulating boss 144 in the upper-lower direction moves relatively downward from the power supply boss 133 by a predetermined distance or more. Therefore, it is possible to prevent a distance or a size of a gap between the upper end of the insulating boss 144 and the lower end surface of the insulating ring 139 placed above the upper end of the insulating boss 144 from becoming larger than an expected distance or size during assembly, alternatively, it is possible to prevent the increase in the distance or the gap due to displacement and deformation such as expansion and contraction caused by the temperature change of the wafer placement electrode 120 during an operation period of the plasma processing apparatus 100.

The protruding portions 133a, 144b may be configured with a combination of one portion that has a cut-out portion in a part of a ring shape protruding in the same size in a peripheral direction of the cylindrical shape and one portion having a shape that is slightly smaller than the size of the cut-out portion such that the one portion can be fitted into the cut-out portion and pass through the cut-out portion up and down. Further, it is desirable that the upper surface of the protruding portion 133a and the lower surface of the protruding portion 144b have a shape forming a flat surface having small unevenness in the horizontal direction. In FIGS. 7 to 10, the modification of the embodiment of FIG. 2 having a configuration in which the power supply connector 161 includes the beam-shaped member 135 has been described, but the invention is not limited thereto, similar operations and effects can be obtained by applying the configuration of the modification to the wafer placement electrode 120 of the embodiments shown in FIGS. 4 to 6.

Further, in the above embodiments or modifications, a material to be etched of the film layer to be processed included in the film structure disposed in advance on the upper surface of the wafer 109 before the processing is a silicon oxide film, and methane tetrafluoride gas, oxygen gas, and trifluoromethane gas are used as processing gas for etching the film to be processed and cleaning gas for cleaning, which is supplied to the processing chamber 104. Further, as the material of the film layer to be processed, not only the silicon oxide film but also a polysilicon film, a photoresist film, an antireflection organic film, an antireflection inorganic film, an organic material, an inorganic material, a silicon oxide film, a silicon nitride oxide film, a silicon nitride film, a Low-k material, a High-k material, an amorphous carbon film, a Si substrate, a metal material, or the like can be used, and the same effect can be obtained in these cases as well.

Further, chlorine gas, hydrogen bromide gas, methane tetrafluoride gas, methane trifluoride gas, methane difluoride gas, argon gas, helium gas, oxygen gas, nitrogen gas, carbon dioxide gas, carbon monoxide gas, hydrogen gas, or the like can be used as the processing gas for etching. Further, ammonia gas, octafluoropropane gas, nitrogen trifluoride gas, sulfur hexafluoride gas, methane gas, silicon tetrafluoride gas, silicon tetrachloride gas, neon gas, krypton gas, xenon gas, radon gas, or the like can be used as the processing gas for etching.

Further, the invention is not limited to the above-described embodiments, but includes various modifications. For example, the above-described embodiments have been described in detail for easy understanding of the invention, and it is not necessarily limited to one having all the configurations described above. For example, the wafer placement electrode 120 includes a heater inside the dielectric film 140 or inside the electrode base material 108 to heat the wafer 109 mounted on or above the dielectric film 140 and the electrode base material 108 by supplying an electric current, and the controller 170 may adjust the temperature of the wafer 109 by heating with the heater. Further, for such temperature adjustment, at least one temperature sensor which is disposed inside the electrode base material 108 so as to be communicable with the controller 170 and detects the temperature may be provided.

A part of the configuration of one embodiment can be replaced with the configuration of another embodiment, and the configuration of another embodiment can be added to the configuration of one embodiment. Further, other configurations may be added to, deleted from, or replaced with a part of a configuration of each embodiment. It should be noted that each member and the relative size described in the drawings are simplified and idealized in order to easily understand the invention, and are more complicated in terms of implementation.

In the above embodiment, a configuration has been described in which a microwave electric field having a frequency of 2.45 GHz and a magnetic field capable of forming an ECR are supplied into the processing chamber 104 at the same time, and the processing gas is discharged to form plasma. However, in the configuration described in the above embodiment, even when plasma is formed using other discharge (magnetic field UHF discharge, capacitively coupled discharge, inductively coupled discharge, magnetron discharge, surface wave excitation discharge, and transfer coupled discharge), the configuration can exhibit similar operations and effects to those described in the above-described embodiment or the like. Further, in a case where the above-described embodiments and modifications are applied to a wafer placement electrode disposed in another plasma processing apparatus that performs plasma processing, such as a plasma CVD apparatus, an asking apparatus, and a surface modification apparatus, similar operations and effects can be obtained.

REFERENCE SIGN LIST

100: plasma etching apparatus
101: vacuum container

102: shower plate
102a: gas introduction hole
103: dielectric window
104: processing chamber
105: waveguide
106: electric field generating power source
107: magnetic field generating coil
108: electrode base material
109: semiconductor wafer
110: vacuum exhaust port
111: conductor film
112: grounding portion
113: susceptor ring
116: plasma
120: wafer placement electrode
120a: placement surface
120b: upper surface
120c: through hole
120d: recessed portion
124: radio frequency power source
125: radio frequency filter
126: direct current power source
127: radio frequency power source
128, 129: matching device
130: load impedance variable box
131: conductor ring
132: fastening screw
133: power supply boss
134: O-ring
135: beam-shaped member
136: insulating screw
137: upper portion susceptor ring
138: contact surface
139: insulating ring
139a, 139d: through hole
140: dielectric film
141: space
142: insulating sleeve
143: insulating film
144: insulating boss
145: sealing member
146: electrode base
147: connecting column
148: guide member
149: space
150: insulating plate
151: grounding plate
152: refrigerant flow path
153: stranded wire
160: electric field and magnetic field forming portion
161: power supply connector
162, 163: fastening screw
164: lid member

The invention claimed is:

1. A plasma processing apparatus, comprising:
a processing chamber that is disposed inside a vacuum
    container;

a sample stage that is disposed inside the processing
    chamber and on an upper surface of which a wafer to
    be processed is placed;
a ring-shaped electrode made of a conductor, which is
    disposed on an outer peripheral side of the upper
    surface of the sample stage so as to surround the sample
    stage and to which radio frequency power is supplied;
a dielectric cover that is placed above the ring-shaped
    electrode and covers the ring-shaped electrode;
a base material that has a disc or cylindrical shape and
    forms the sample stage, the base material being con-
    figured to receive a first radio frequency power from a
    first radio frequency power source during processing of
    the wafer;
a rod that is suspended and disposed in a through hole
    disposed on an outer peripheral side portion of the base
    material, and has a connector portion on an upper end
    portion of the rod connected to the ring-shaped elec-
    trode and positioned at the ring-shaped electrode and at
    a lower end portion exposed in a space below a bottom
    surface of the base material;
a beam-shaped member that is disposed below the sample
    stage below the through hole with a gap therebetween
    and extends in a horizontal direction, one end of the
    beam-shaped member is connected to the lower end
    portion of the rod and a position of another end at least
    in an upper and lower direction is fixed with respect to
    the sample stage, and the another end is configured to
    urge the rod upward with respect to the ring-shaped
    electrode; and
a second radio frequency power source that is connected
    to the rod via a power supply path and which supplies
    second radio frequency power to the ring-shaped elec-
    trode.

2. The plasma processing apparatus according to claim 1,
wherein
    the other end of the beam-shaped member is positioned
        below a central portion of the base material with
        respect to the sample stage.

3. The plasma processing apparatus according to claim 1,
wherein
    the rod forms the power supply path.

4. The plasma processing apparatus according to claim 1,
wherein
    the beam-shaped member is a leaf spring that urges the
        rod upward.

5. The plasma processing apparatus according to claim 1,
wherein
    the beam-shaped member made of metal forms the power
        supply path.

6. The plasma processing apparatus according to claim 1,
further comprising:
    a heater that is disposed inside the sample stage to heat the
        wafer.

* * * * *